United States Patent
Burrows et al.

(10) Patent No.: US 8,764,239 B2
(45) Date of Patent: Jul. 1, 2014

(54) DYNAMIC STRETCHABLE OLED LAMP

(75) Inventors: Paul E. Burrows, Chattaroy, WA (US); Huiqing Pang, Newtown, PA (US); Peter A. Levermore, Lambertville, NJ (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 409 days.

(21) Appl. No.: 13/210,990

(22) Filed: Aug. 16, 2011

(65) Prior Publication Data
US 2013/0044487 A1    Feb. 21, 2013

(51) Int. Cl.
*H01L 51/52* (2006.01)
*F21V 14/02* (2006.01)

(52) U.S. Cl.
CPC .............. *F21V 14/02* (2013.01); *H01L 51/52* (2013.01); *H01L 2251/5338* (2013.01)
USPC ...................................... 362/249.08; 362/418

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,771,021 B2 | 8/2004 | Cok | |
| 7,049,757 B2 | 5/2006 | Foust et al. | |
| 7,075,226 B2 | 7/2006 | Cok | |
| 7,279,704 B2 | 10/2007 | Walters et al. | |
| 7,431,968 B1 | 10/2008 | Shtein et al. | |
| 7,746,293 B2 * | 6/2010 | Kobayashi | 345/30 |
| 7,786,951 B2 * | 8/2010 | Huitema et al. | 345/1.2 |
| 7,787,917 B2 * | 8/2010 | Aoki et al. | 455/575.3 |
| 7,830,333 B2 * | 11/2010 | Aoki | 345/1.3 |
| 8,170,631 B2 * | 5/2012 | Aoki et al. | 455/575.3 |
| 8,289,232 B2 * | 10/2012 | Kobayashi | 345/30 |
| 8,430,530 B2 * | 4/2013 | Aurongzeb et al. | 362/249.04 |
| 2003/0230980 A1 | 12/2003 | Forrest et al. | |
| 2004/0174116 A1 | 9/2004 | Lu et al. | |
| 2005/0110702 A1 * | 5/2005 | Aoki et al. | 345/30 |
| 2006/0232194 A1 | 10/2006 | Tung | |
| 2010/0295032 A1 | 11/2010 | Kwong et al. | |
| 2011/0057559 A1 | 3/2011 | Xia et al. | |

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Britt D Hanley
(74) *Attorney, Agent, or Firm* — Sterne Kessler Goldstein & Fox P.L.L.C.

(57) ABSTRACT

Flexible substrates bearing OLEDs are provided. The flexible substrates are attached to support structures that, when moved, cause the flexible structures to change shape and to thereby change the distribution of radiant intensity emanating from the OLEDs on the flexible substrates.

35 Claims, 25 Drawing Sheets

(56) References Cited

OTHER PUBLICATIONS

Baldo et al., "Very high-efficiency green organic light-emitting devices based on electrophosphorescence," Appl. Phys. Lett., vol. 75, No. 3, 4-6 (1999).

Tucker et al. "Strain Deconcentration in Thin Films Patterned with Circular Holes" Int. 1. Appl. Mech. 1,557 (2009).

Rogers et al. "Optical evaluation of the flexural rigidity and residual stress in thin membranes: Picosecond transient grating measurements of the dispersion of the lowest-order Lamb acoustic waveguide mode" J. Mater. Res., vol. 16, No. 1, Jan. 2001, pp. 217-225.

NASA Technical Note D-3270: Techniques for the Measurement of the Flexural Rigidity of Thin Films and Laminates, H. L. Price, Apr. 1966.

BS 3356:1990, British Standard Method for Determination of Bending Length and Flexural Rigidity of Fabrics, British Standards Institution © 1999.

Oled-Info.com; "Novaled shows a new "Jumping Flash" transparent OLED lamp design" http://www.oled-info.com/novaled-shows-new-jumping-flash-transparent-oled-lamp-design Jan. 11, 2011.

\* cited by examiner

A.

B.

C.

A.

B.

DYNAMIC STRETCHABLE OLED LAMP

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to lighting devices, and in particular to flexible organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted $Ir(ppy)_3$, which has the following structure:

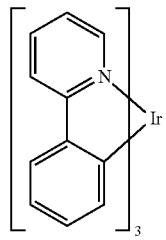

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In one aspect, a light source is provided. The light source comprises a support structure having at least a first and a second portion, and a first flexible substrate having at least a first, a second and a third region. The first region of the first flexible substrate is attached to the first portion of the support structure, and the third region of the first flexible substrate is attached to the second portion of the support structure. A first OLED is disposed on at least part of the second region of the first flexible substrate. The shape of the second region of the first flexible substrate and the shape of at least a part of the first OLED change when the first portion of the support structure is moved relative to the second portion of the support structure. In one aspect, the second portion of the support structure is movably attached to the first portion of the support structure.

In one aspect, the support structure further comprises a third portion. The first flexible substrate further comprises a fourth and a fifth region, and the fifth region of the first flexible substrate is attached to the third portion of the support structure. The shape of the fourth region of the first flexible substrate changes when the third portion of the support structure is moved relative to the second portion of the support structure. In one aspect, the third portion of the support structure is movably attached to the second portion of the support structure.

In one aspect, the first OLED is disposed on at least part of the second region and at least part of the fourth region of the first flexible substrate. The shape of at least a part of the first OLED changes when the first portion of the support structure is moved relative to the second portion of the support structure or the third portion of the support structure is moved relative to the second portion of the support structure.

In one aspect, the light source further comprises a second OLED. The first OLED is disposed on at least part of the second region of the first flexible substrate, and the second OLED is disposed on at least part of the fourth region of the first flexible substrate. The shape of at least a part of the second OLED changes when the third portion of the support structure is moved relative to the second portion of the support structure.

In one aspect, the light source further comprises a second flexible substrate having at least a first, a second, and a third region. A second OLED is disposed on at least part of the second region of the second substrate. The support structure further comprises a third portion. The first region of the second flexible substrate is attached to the second portion of the support structure, and the third region of the second flexible substrate is attached to the third portion of the support structure. The shape of the second region of the second flexible substrate and the shape of at least a part of the second OLED change when the third portion of the support structure is moved relative to the second portion of the support structure. In one aspect, the third portion of the support structure is movably attached to the second portion of the support structure.

In one aspect, the support structure includes a third portion and a fourth portion. At least one of the first and second portions of the support structure is movably attached to at least one of the third and fourth portions of the support structure. The light source comprises a second flexible substrate having a first region, a second region and a third region. A second OLED is disposed on at least a part of the second flexible substrate. The first region of the second flexible substrate is attached to the third portion of the support structure, and the third region of the second flexible substrate is attached to the fourth portion of the support structure. The shape of the second region of the second flexible substrate and the shape of at least a part of the second OLED change when the fourth portion of the support structure is moved relative to the third portion of the support structure. In one aspect, the fourth portion of the support structure is movably attached to the third portion of the support structure.

In one aspect, the light source further comprises at least one rigid substrate. In another aspect, a third OLED is disposed onto the at least one rigid substrate.

In one aspect, the light source comprises a plurality of flexible substrates operably attached to one rigid substrate, and the plurality of flexible substrates comprises one or more OLEDs disposed on the plurality of flexible substrates.

In one aspect, the flexible substrate comprises metal foil, plastic, glass, or combinations thereof.

In one embodiment, the first and second portions of the support structure move out of a starting plane that, prior to the movement of the support structures, includes both support structures. In one embodiment, the first and second portions of the support structure move perpendicular to the starting plane. In another embodiment, the first and second portions of the support structure are located in a single plane, and the first and second portions of the support structure move within the plane where they are located.

In one embodiment, the first and second portions of the support structure rotate such that the flexible substrate is not twisted. In another embodiment, the first and second portions of the support structure rotate such that the flexible substrate is twisted.

In one aspect, the first and second portions of the support structure move in any combination of the first and second portions of the support structure move out of a starting plane that, prior to the movement of the support structures, includes both support structures; the first and second portions of the support structure move perpendicular to a starting plane that, prior to the movement of the support structures, includes both support structures; the first and second portions of the support structure are located in a single plane, and the first and second portions of the support structure move within the plane where they are located; the first and second portions of the support structure rotate such that the flexible substrate is not twisted; and the first and second portions of the support structure rotate such that the flexible substrate is twisted.

In one aspect, the second portion of the support structure is rotatable relative to the first portion of the support structure. In one aspect, the light source has an extendible accordion structure.

In one embodiment, substantially no OLED is disposed on the first and third regions of the first flexible substrate. In one embodiment, substantially no first OLED is deposited on the attachment point of the first and third regions of the first flexible substrate. In one embodiment, the first OLED is disposed on at least a portion of the first, second, and third regions of the first flexible substrate.

In one aspect, the movement of the second portion of the support structure relative to the first portion of the support structure changes a radius of curvature of the first flexible substrate. In another aspect, the movement of the second portion of the support structure relative to the first portion of the support structure is constrained such that the minimum radius of curvature of the first flexible substrate is between 1.0 cm and 20.0 cm.

In one aspect, the movement of the second portion of the support structure relative to the first portion of the support structure is constrained such that the minimum radius of curvature of the first flexible substrate is between 5.0 cm and 15.0 cm.

In one aspect, an electrical connection is present through the first portion of the support structure and the first region of the flexible substrate.

In one aspect, the change in shape of the light source changes the distribution of radiant intensity emanating from the light source.

In one aspect, the change in shape of the light source can change the distribution of radiant intensity emanating from the light source from a symmetric profile to an asymmetric profile with respect to one axis of the light source.

In one aspect, the first and second portions of the support structure are connected by an elastic connection. In one aspect, the elastic connection comprises a light scattering layer.

In one aspect, the change in shape of the light source increases the irradiance of at least one point on an irradiance plane by as much as about 2 fold compared to the irradiance prior to the change in shape. In another aspect, the change in shape of the light source decreases the irradiance of at least one point on an irradiance plane by as much as about 2 fold compared to the irradiance prior to the change in shape.

BRIEF DESCRIPTION OF THE DRAWINGS

FIG. 3a) shows a three dimensional view of the light source, and FIG. 3b) shows a two dimensional view of the light source.

FIG. 4a) shows a three dimensional view of the light source, and FIG. 4b) shows a two dimensional view of the light source.

FIG. 5a) shows a three dimensional view of the light source, and FIG. 5b) shows a two dimensional view of the light source.

FIG. 6a) shows a three dimensional view of the light source using rails as an external connection, and FIG. 6b) shows a two dimensional view of a light source having any external connection.

FIG. 7a) shows a three dimensional view of the light source, and FIG. 7b) shows a two dimensional view of the light source having any external connection.

FIG. 13A shows a flexible substrate held by two support structures, and an OLED is disposed on the flexible substrate. The support structures are connected through an external means, such that the motion of the support structures can be controlled. FIG. 13B shows a corresponding light source, which further comprises OLEDs deposited on rigid substrates.

FIG. 17A shows the layout of the anode, FIG. 17B shows the layout of the bus line layer, FIG. 17C shows the layout of the organic layers, FIG. 17D shows the layout of the cathode, and FIG. 17E shows the layout of the overall panel.

FIG. 20A shows a three dimensional view of the light source, and FIG. 20B shows a two dimensional view of the light source having any external connection.

FIG. 21A shows a three dimensional view of the light source, and FIG. 21B shows a two dimensional view of the light source having any external connection.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
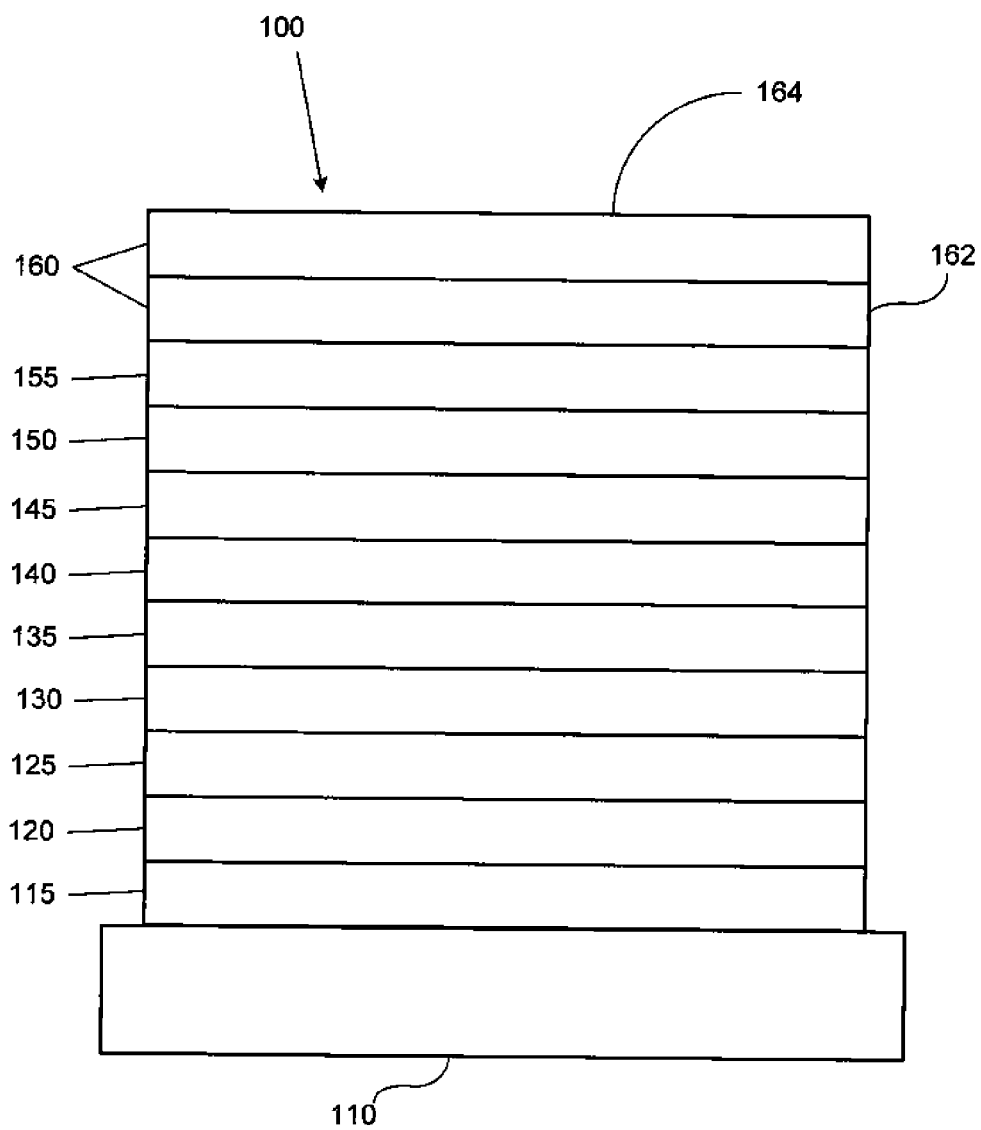
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
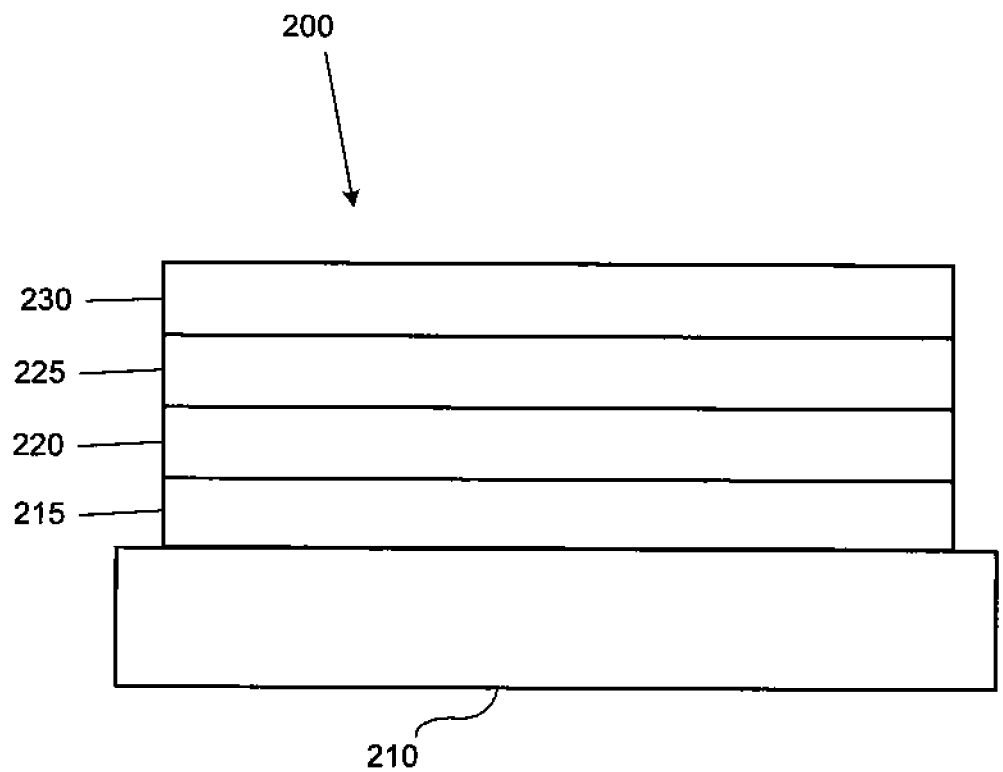
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution proccessability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
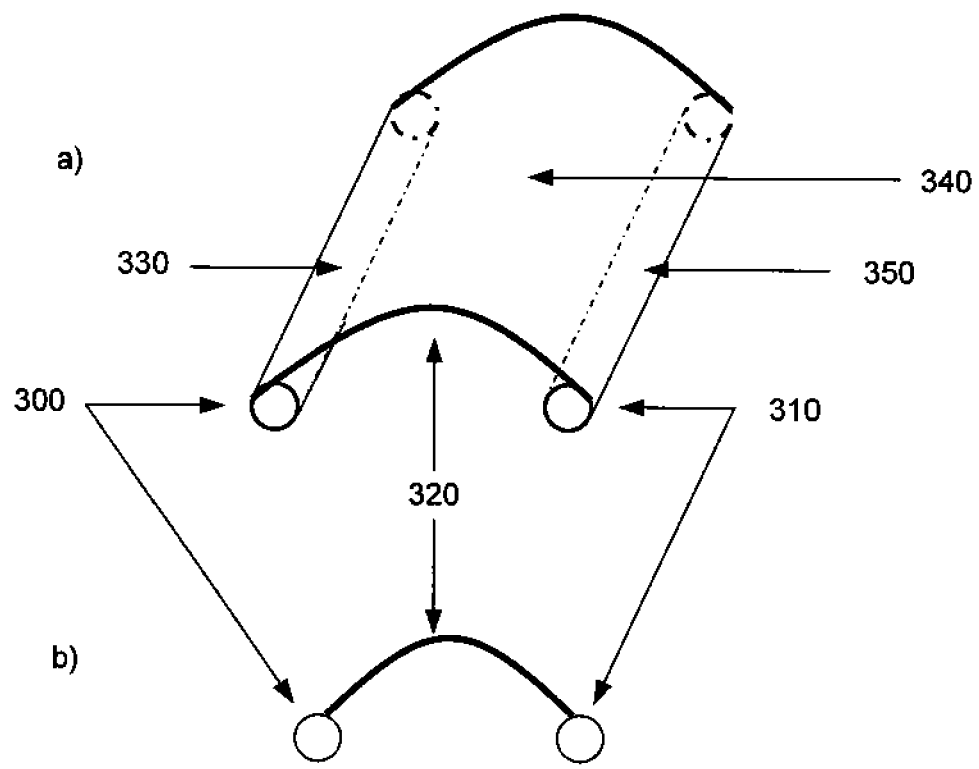
FIG. 3 shows an exemplary light source comprising a flexible substrate attached to two support structures.
Figure 4:
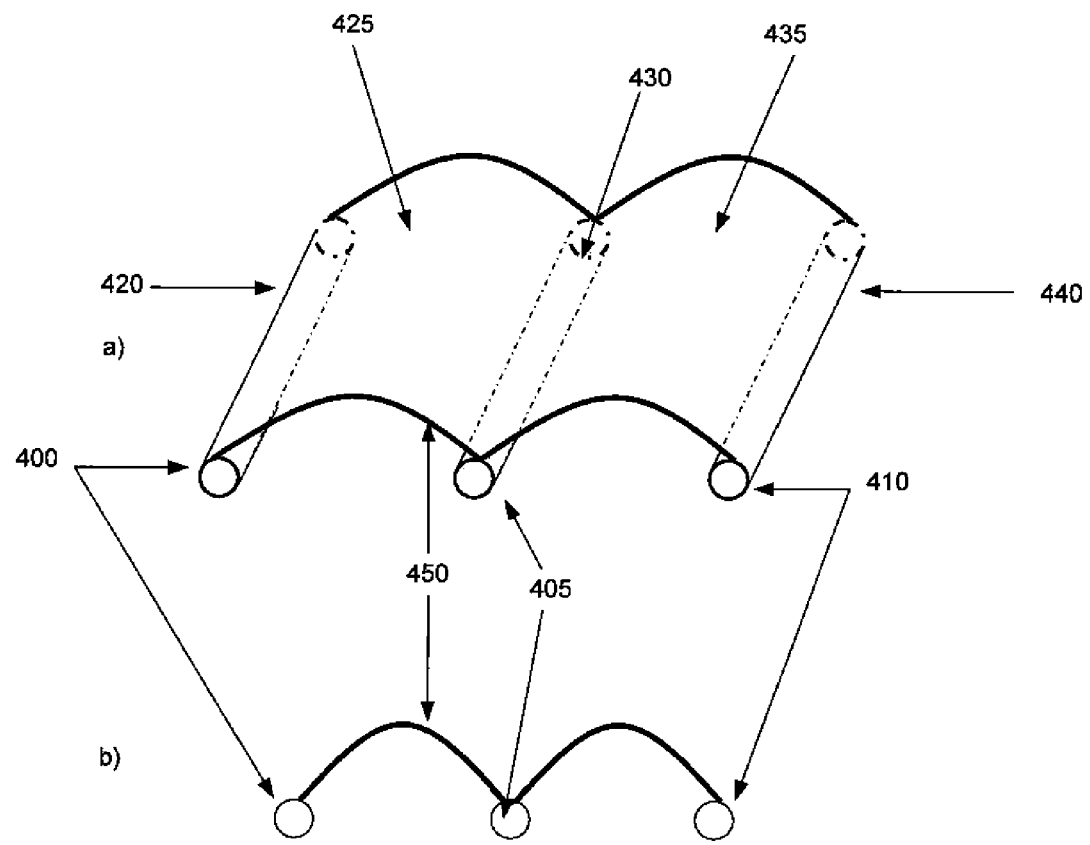
FIG. 4 shows an exemplary light source having a first flexible substrate attached to three support structures.
Figure 5:
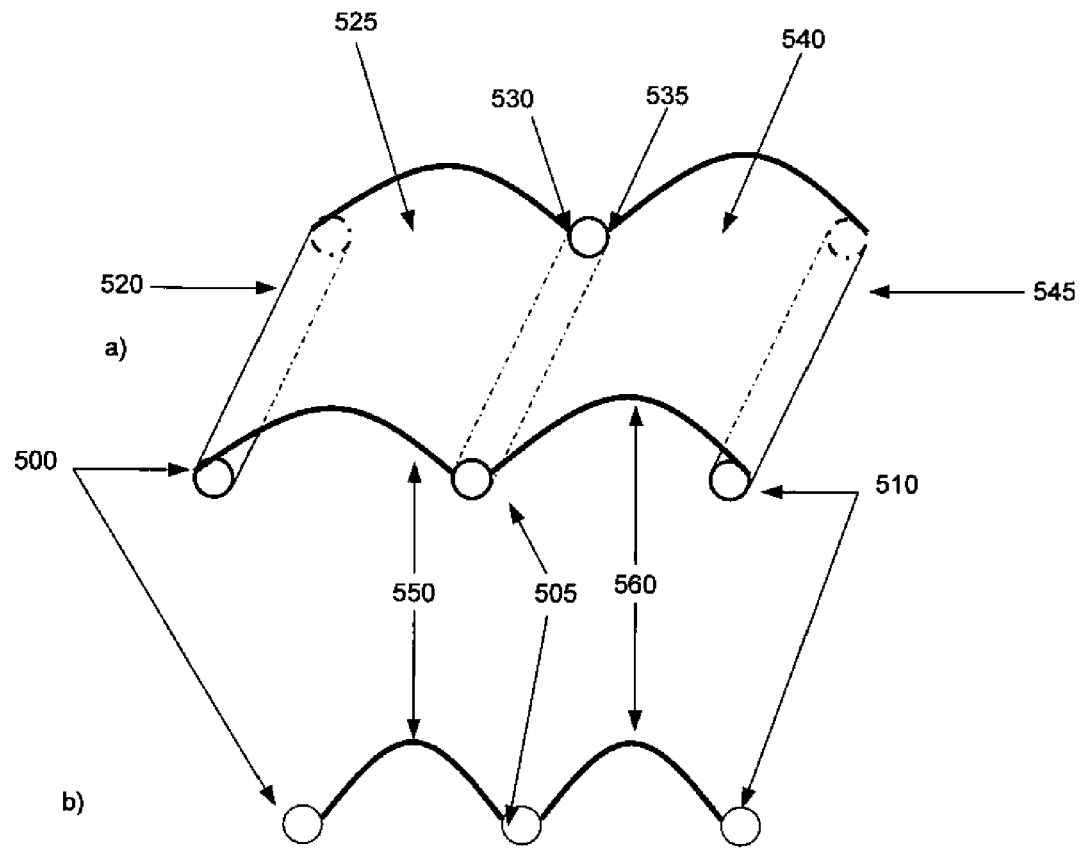
FIG. 5 shows an exemplary light source having a first flexible substrate and a second flexible substrate attached to support structures.

In one embodiment, a light source is provided. The light source comprises a support structure having at least a first and a second portion, and a first flexible substrate having at least a first, a second and a third region. The first region of the first flexible substrate is attached to the first portion of the support structure, and the third region of the first flexible substrate is attached to the second portion of the support structure. A first OLED is disposed on at least part of the second region of the first flexible substrate. The shape of the second region of the first flexible substrate and the shape of at least a part of the first OLED change when the first portion of the support structure is moved relative to the second portion of the support structure. In one embodiment, the second portion of the support structure is movably attached to the first portion of the support structure. In one embodiment, the light source is depicted in FIG. 3a), and its cross-section is depicted in FIG. 3b). The support structure has a first portion 300 and a second portion 310. A first flexible substrate 320 contains first region 330, second region 340, and third region 350, whereby the first region 330 is attached to the first portion 300 of the support structure and the third region 350 is attached to the second portion 310 of the support structure.

A support structure can be any object to which one or more flexible substrates can be attached. The attachment of the flexible substrate can be by any suitable means that will still allow for effective function of the light source. For example, and without any limitation, the flexible substrate can be attached mechanically (e.g. clipped onto the support structure or otherwise held against the support structure by an external fastening) or the flexible substrate may be attached via a suitable adhesive material. In some embodiments, one or more flexible substrates may be removably attached to support structures. This would allow straightforward replacement of the one or more flexible substrates. The flexible substrate may comprise any of the suitable materials described below. In some embodiments, the OLED is disposed on at least 30%, at least 50%, at least 70%, or at least 90% of the surface area of the flexible substrate. OLED deposition may be made using any of the conventional techniques known in the art.

Figure 6:
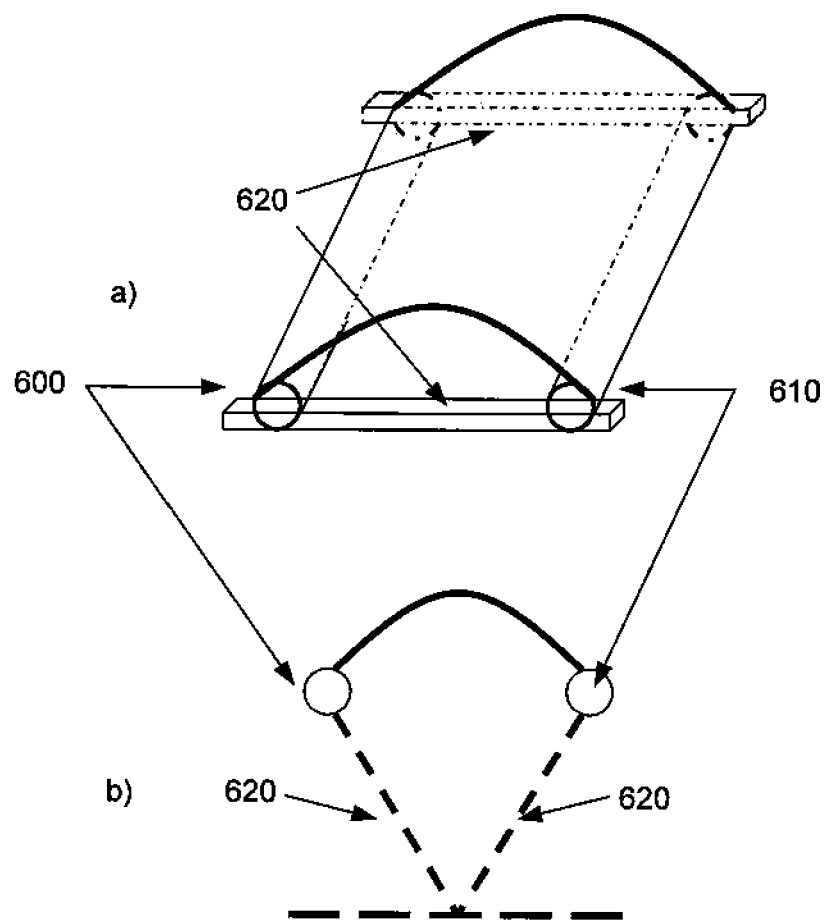
FIG. 6 shows an exemplary light source having support structures that are movably attached via an external structure.

By "movably attached" it is meant that the portions of the support structures may be independently movable relative to each other to within the material limits provided by the flexible substrate. Examples are shown in FIGS. 3-5 and FIG. 16, and they will be discussed in detail below. "Movably attached" is also intended to encompass support structures that are themselves attached to another external structure or structures. Connection through external structures may cause concomitant movement of the support structures, and thereby alteration of the shape of the flexible substrate. In one embodiment, the light source is as depicted in FIG. 6. This embodiment is similar to the embodiment depicted in FIG. 3, but here the first portion 600 and the second portion 610 of the support structures are movably attached via an external structure 620.

Figure 12:
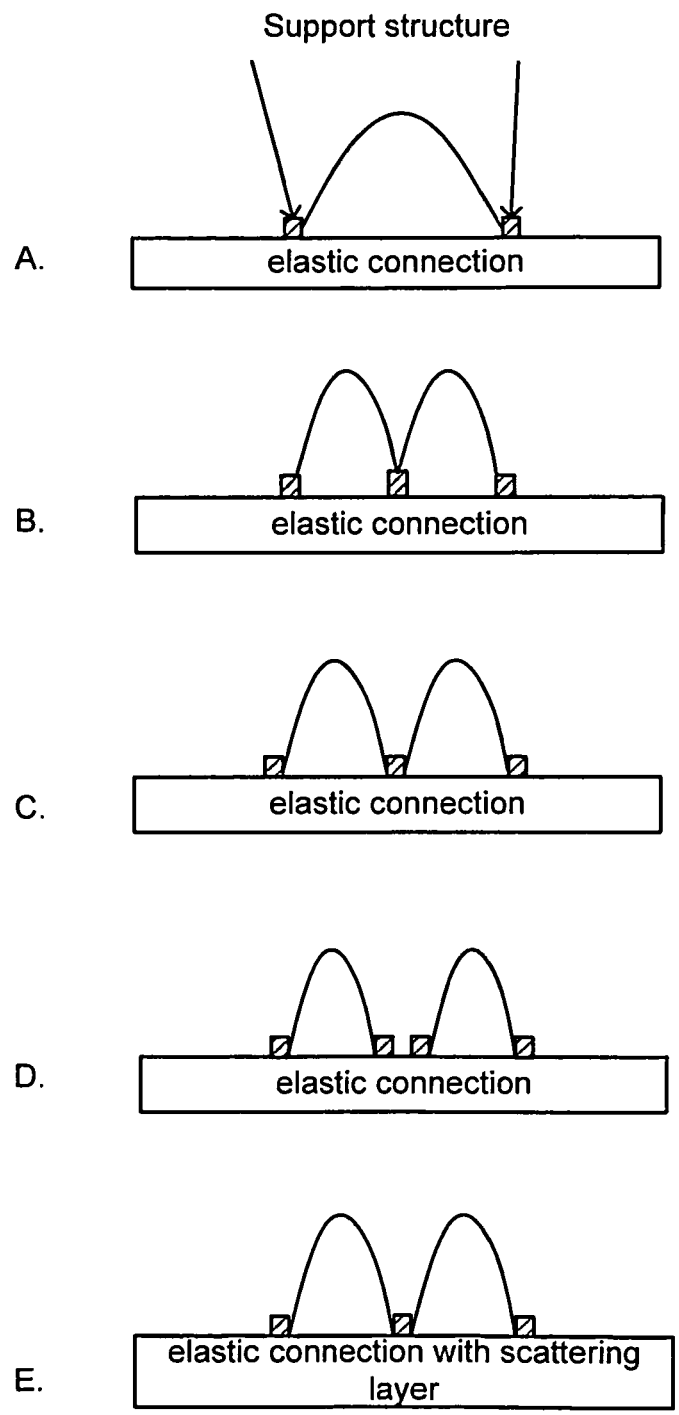
FIGS. 12A-E show exemplary light sources in which the external structure is an elastic connection, and the support structures are connected through an elastic sheet or elastic string.
Figure 13:
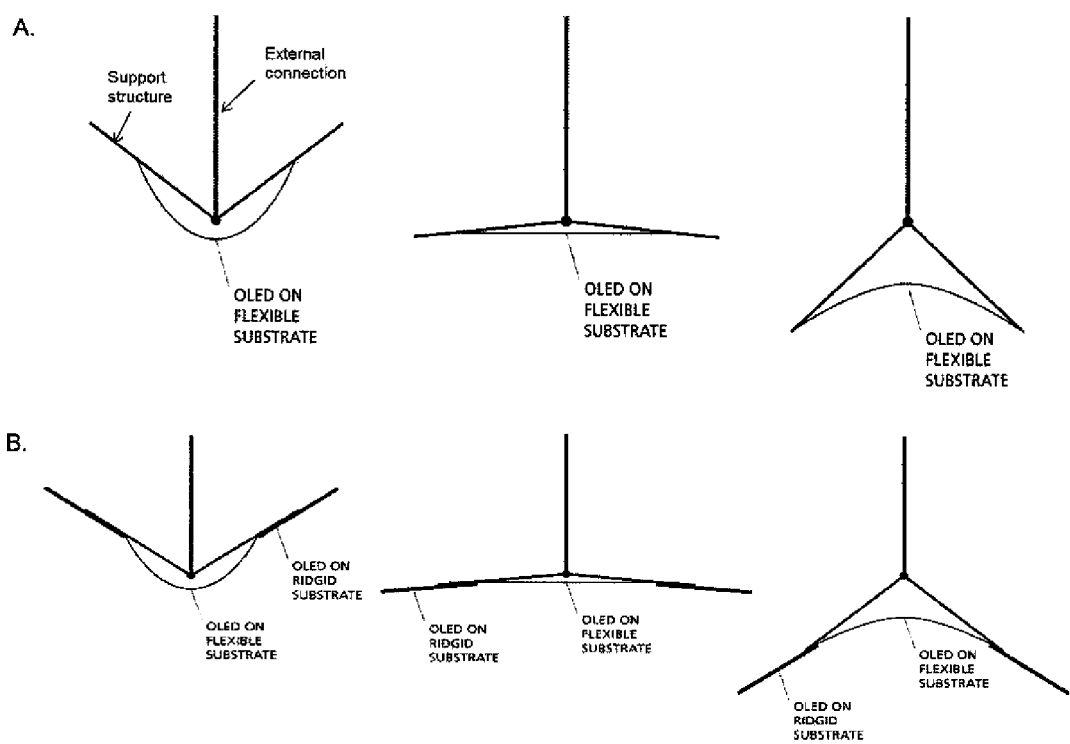
FIG. 13 shows exemplary external connections.

There are various ways to form external connection for the support structures. FIG. 6a) illustrates one example using two rails 620 to connect the first portion 600 and the second portion 610 of the support structures. General external connection is depicted in FIG. 6b) in dashed lines. In one aspect, the external structure may be an elastic connection, where the support structures are connected through an elastic sheet or elastic string, as depicted in FIG. 12a). The supporting structures in FIG. 12a) may be, but are not limited to, pins, clips, adhesive materials, or any other mechanical means. Another example is depicted in FIG. 13a), where a flexible substrate is held by two support structures and an OLED is disposed on the flexible substrate. The support structures are connected through an external means such that the motion of the support structures can be controlled. In one aspect, the supporting structure and/or the external connection may consist of strings, wires, or telescopic poles that are attached to the flexible substrate. It should be understood that any mechanical or electrical means to provide external connection among the support structures may be used here. In one aspect, the motion of the support structures along with the flexible light device may be controlled through external electrical circuitry. In other aspect, the movement of the support structures and the light device may be realized manually. Other examples are shown in FIG. 7, FIG. 14 and FIGS. 20-21, and will be discussed in detail below.

In one embodiment, the support structure further comprises a third portion. The first flexible substrate further comprises a fourth and a fifth region, and the fifth region of the first flexible substrate is attached to the third portion of the support structure. The shape of the fourth region of the first flexible substrate changes when the third portion of the support structure is moved relative to the second portion of the support structure.

In one embodiment, the first OLED is disposed on at least part of the second region and at least part of the fourth region of the first flexible substrate. The shape of at least a part of the first OLED changes when the first portion of the support structure is moved relative to the second portion of the support structure or the third portion of the support structure is moved relative to the second portion of the support structure.

In another embodiment, the light source further comprises a second OLED. The first OLED is disposed on at least part of the second region of the flexible substrate, and the second OLED is disposed on at least part of the fourth region of the flexible substrate. The shape of at least a part of the second OLED changes when the third portion of the support structure is moved relative to the second portion of the support structure.

In yet another embodiment, the third portion of the support structure is moved relative to the second portion of the support structure. In one embodiment, the light source is as depicted in FIGS. 4a) and 4b). The support structure has a first portion 400, a second portion 405, and a third portion 410. A first flexible substrate 450 is attached to the first, second, and third portions of the support structures, and contains a first region 420, a second region 425, a third region 430, a fourth region 435, and a fifth region 440, whereby the first region 420 is attached to the first portion 400 of the support structure, the third region 430 is attached to the second portion 405 of the support structure and the fifth region 440 is attached to the third portion 410 of the support structure. A first OLED is disposed on at least part of the second region 425 and at least part of the fourth region 435 of the first flexible substrate.

In one embodiment, the light source further comprises a second flexible substrate having at least a first, a second, and a third region. A second OLED is disposed on at least part of the second region of the second substrate. The support structure further comprises a third portion. The first region of the second flexible substrate is attached to the second portion of the support structure, and the third region of the second flexible substrate is attached to the third portion of the support structure. The shape of the second region of the second flexible substrate and the shape of at least a part of the second OLED change when the third portion of the support structure is movably attached to the second portion of the support structure. In one embodiment, the third portion of the support structure is movably attached to the second portion of the support structure. In one embodiment, the light source is as depicted in FIGS. 5a) and 5b). The support structure has a first portion 500, a second portion 505, and a third portion 510. A first flexible substrate 550 is attached to the first and second portions of the support structure, and contains a first region 520, a second region 525, and a third region 530. The first region 520 is attached to the first portion 500, the second region 525 is not attached to a support, and the third region 530 is attached to the second portion 505 of the support structure. A second flexible substrate 560 is attached to the second and third portions of the support structure, and contains a first region 535, a second region 540, and a third region 545. The first region 535 is attached to the second portion 505, the second region 540 is not attached to a support, and the third region 545 is attached to the third portion 510 of the support structure. A first OLED is disposed on at least part of the second region 525 of the first flexible substrate 550, and a second OLED is disposed on at least part of the second region 540 of the second flexible substrate 560.

Figure 20:
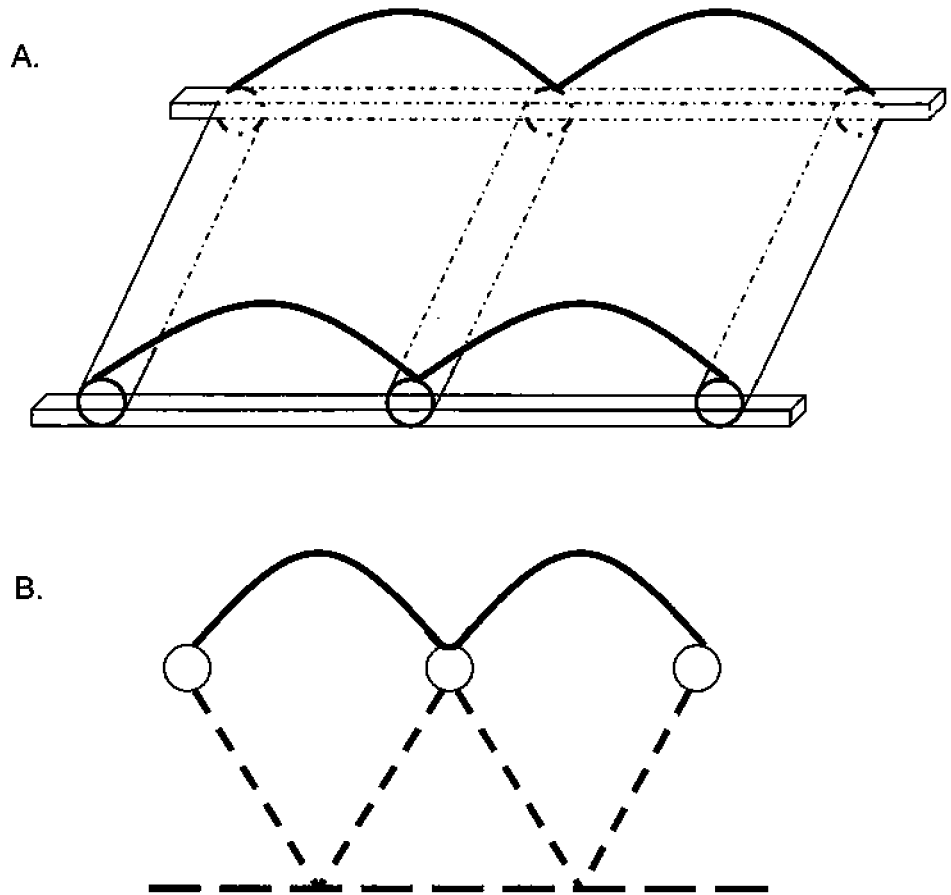
FIG. 20 shows an exemplary light source comprising one substrate and three support structures, and rails are used to form the external connection.
Figure 21:
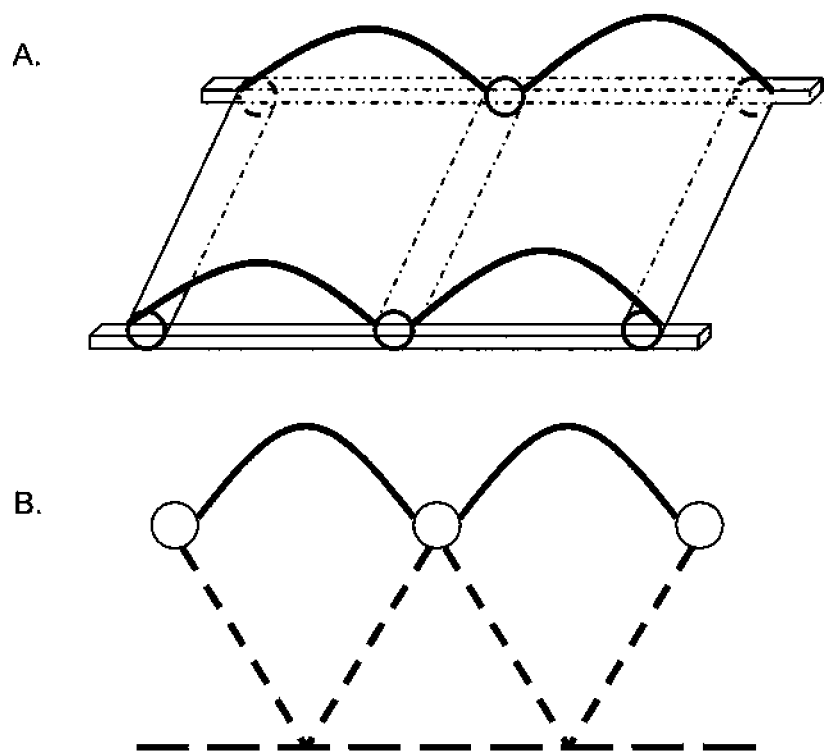
FIG. 21 shows an exemplary light source comprising multiple substrates and using rails to form the external connection.

In one embodiment, the support structures are connected through an external means, so that they are movably attached. FIG. 20 and FIG. 21 illustrate one substrate and multiple substrates, respectively, with multiple support structures that are externally connected so that they are movably attached. FIG. 20A shows an exemplary light source comprising one substrate with at least one OLED disposed on it, and using rails to form the external connection. FIG. 20B shows a general external connection among the support structures in the light source. FIG. 21A shows an exemplary light source comprising multiple substrates, whereby at least one OLED is disposed on each of the substrates, and using rails to form the external connection. FIG. 21B shows a general external connection among the support structures in the light source.

Figure 7:
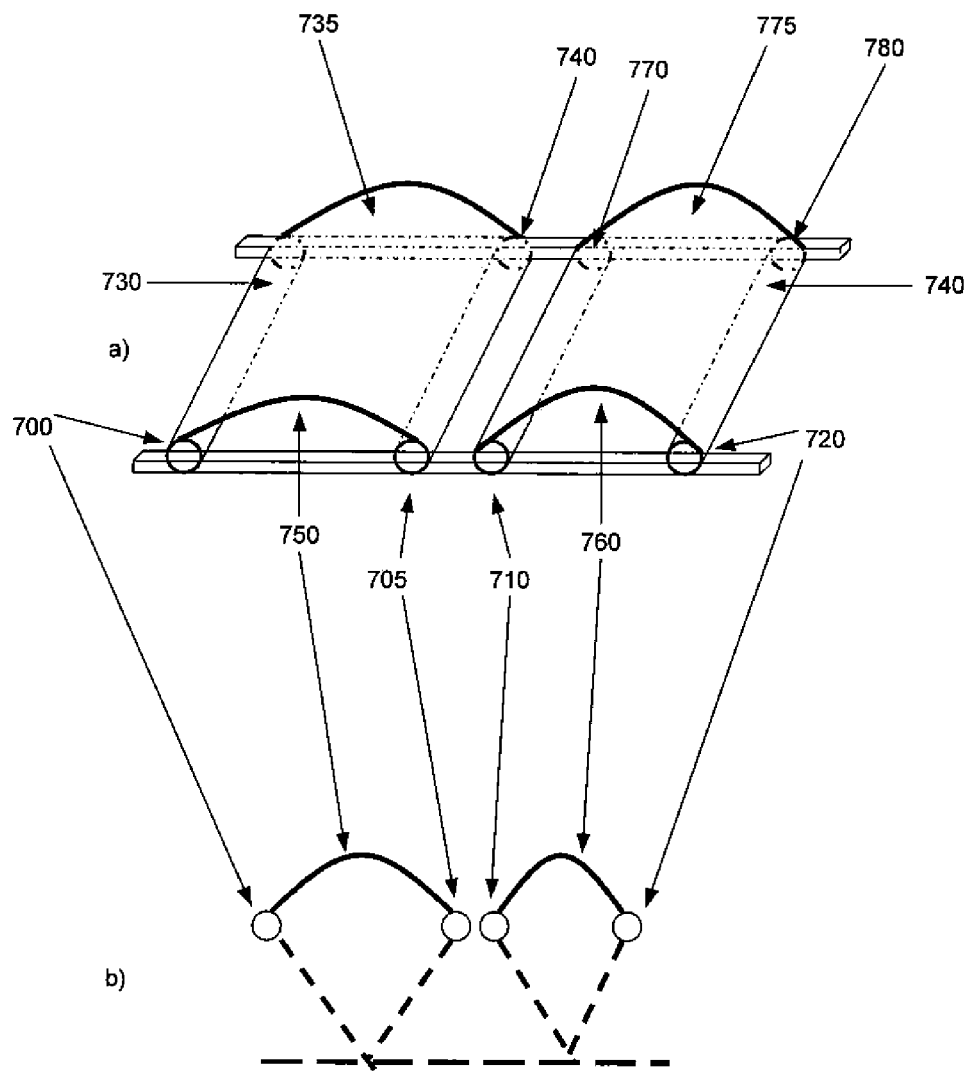
FIG. 7 shows an exemplary light source in which two flexible substrates can be moved independently through multiple support structures having an external connection.

In one aspect, the support structure includes a third portion and a fourth portion. At least one of the first and second portions of the support structure is movably attached to at least one of the third and fourth portions of the support structure. The light source comprises a second flexible substrate having a first region, a second region and a third region. A second OLED is disposed on at least a part of the second flexible substrate. The first region of the second flexible substrate is attached to the third portion of the support structure, and the third region of the second flexible substrate is attached to the fourth portion of the support structure. The shape of the second region of the second flexible substrate and the shape of at least a part of the second OLED change when the fourth portion of the support structure is movably attached to the third portion of the support structure. In one aspect, the fourth portion of the support structure is movably attached to the third portion of the support structure. In one embodiment, the light source is as depicted in FIG. 7. FIG. 7 depicts support structures having a first portion 700, a second portion 705, a third portion 710, and a fourth portion 720. The first flexible substrate 750 has a first region 730 attached to the first portion 700 of the support structure, a second region 735, and a third region 740 attached to the second portion 705 of the support structure. A first flexible OLED is disposed on at least part of the first flexible substrate 750. The second flexible substrate 760 has a third region 770 attached to the third portion 710 of the support structure, a fourth region 775, and a fifth region 780 attached to the fourth portion 720 of the support structure. A second OLED is disposed on at least part of the second flexible substrate 760. In FIG. 7, the support structures are movably attached as defined above, but the first and second portions can move independently from the third and fourth portions and the first and second flexible substrates are also able to move independently. In other words, multiple substrates may be moved independently through multiple support structures, while there is an external connection among the support structures.

In one embodiment, the light source further comprises at least one rigid substrate. The rigid substrate may be attached to the support structure by any suitable means known to those of skill in the art, including mechanical and adhesive means. In one aspect, a third OLED is disposed on the at least one rigid substrate. FIG. 13b) shows the support structures holding two rigid substrates and one flexible substrate, where OLEDs are disposed on both the rigid and flexible substrates.

In one embodiment, the light source comprises a plurality of flexible substrates operably attached to one rigid substrate, and the plurality of flexible substrates comprises one or more OLEDs disposed on the plurality of flexible substrates. In this embodiment, the plurality of flexible substrates described above forms a flower-like structure, with the plurality of flexible substrates being analogous to the petals of a flower.

Figure 14:
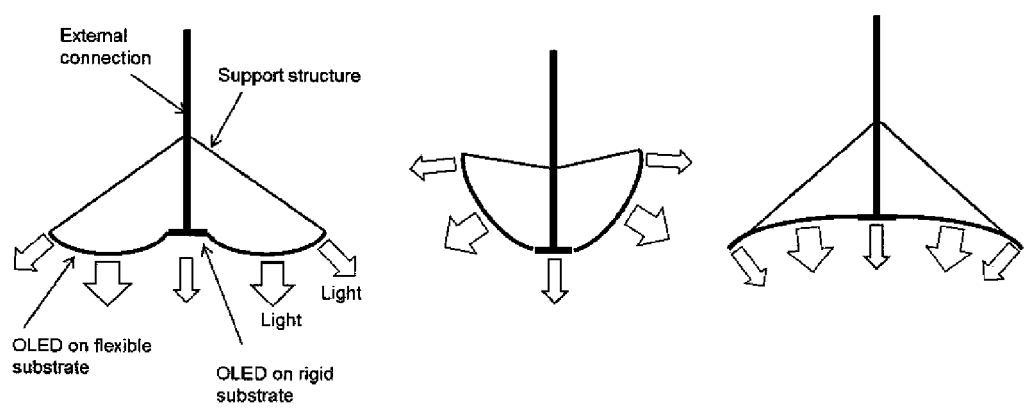
FIG. 14 shows an exemplary light source comprising OLEDs deposited on a rigid substrate and two flexible substrates, which are held by a support structure.

FIG. 14 depicts a light source where a rigid substrate is held by a rod in the center. Two flexible substrates are attached to the rigid substrate at one end and to a support structure at the other. OLEDs are disposed on all three substrates with light emitting away from the support structures. The two support structures are connected through the center rod. The support structures may be, but are not limited to, flexible strings, rigid rods, flexible sheets, elastic materials or any mechanical means that is suitable to facilitate the control of the motion. By moving the support structures (varying the angle and/or length of the support structures) through the external connection, the curvature of the flexible substrates can be controlled and the distribution of radiant intensity from the OLED can be controlled accordingly.

In one embodiment, the flexible substrate comprises metal foil, plastic, glass, or combinations thereof. In one embodiment, the metal foil comprises an aluminum foil, stainless steel foil, copper foil or combinations thereof. Thus, the substrates can comprise single materials, compound materials, and/or laminated layers. In one embodiment, the stainless steel foil has a thickness of about 20 microns to about 300 microns. In another embodiment, the plastic comprises polyethylene terephthalate, polyethylene naphthalate, or combinations thereof. In one embodiment, the plastic has a thickness of about 40 microns to about 600 microns. In one embodiment, the metal foil comprises aluminum foil. In one embodiment, the aluminum foil has a substrate thickness of about 30 microns to about 500 microns. In one embodiment, the glass comprises flexible glass. In one embodiment, the flexible glass comprises borosilicate glass with a thickness of about 50 microns to about 800 microns. The exact thickness requirements depend on the substrate processing, lamination, device layers, etc., and are readily ascertainable by one of skill in the art.

Figure 15:
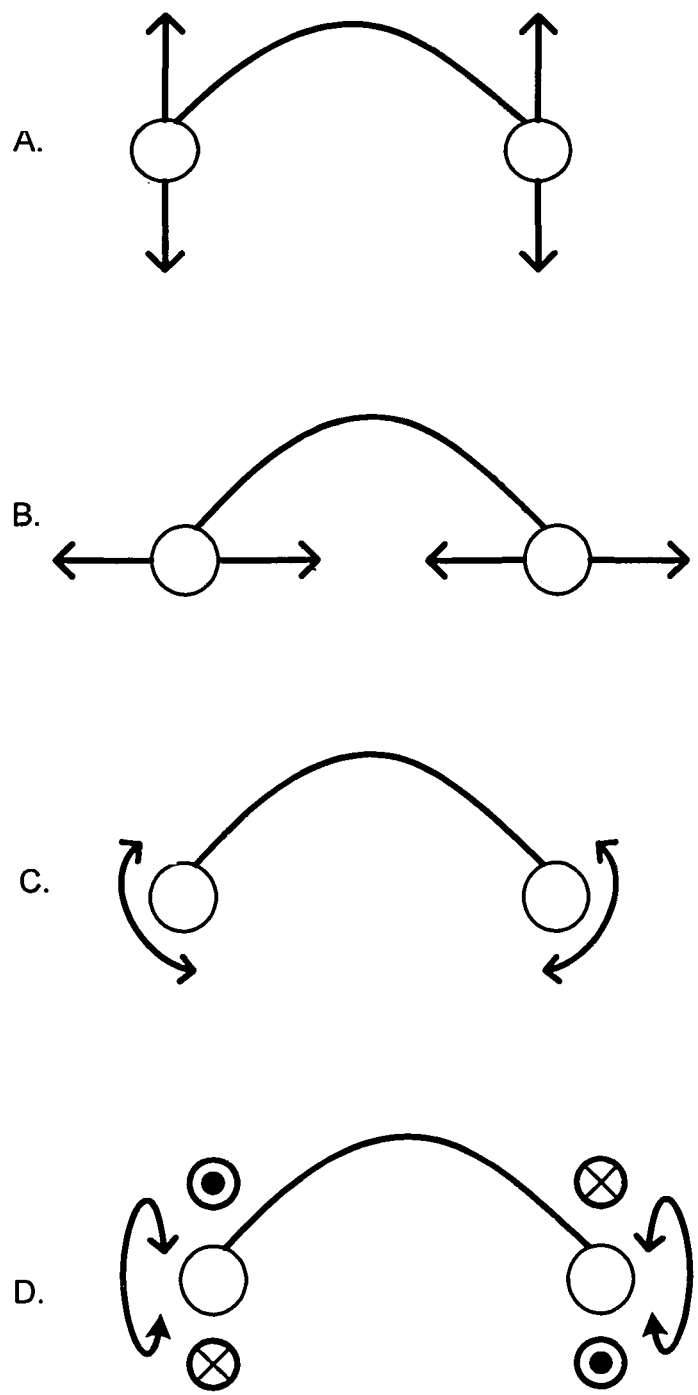
FIG. 15 shows various ways in which the flexible substrates and/or support structures of the light source may move to change the shape and, thus, the distribution of radiant intensity emanating from the light source.

FIG. 15 illustrates examples where the support structures are cylinders, and a cross-section perpendicular to the axis of the cylinder is shown. In this example, the x-direction runs from the left of the page to the right of the page; the y-direction runs from the bottom of the page to the top of the page; and the z-direction runs into the page. FIG. 15A shows support structures that move perpendicular to a starting plane that, prior to the movement of the support structures, includes both support structures. In this example, the x and z axes lie in the starting plane and the support structures move in the y-direction. FIG. 15B shows support structures located in a single plane that move within the plane where they are located. In this example, the x and z axes lie in the starting plane and the support structures move in the x-direction. FIGS. 15C and D illustrate examples of rotation of the first support structure relative to the second support structure to change the shape of the substrate. FIG. 15C shows support structures that rotate about the axis of the cylinder. In this example, this is rotation about the z-axis. This does not result in twisting of the flexible substrate, such that the component of the normal vector to the substrate surface in the x- and y-directions may change, but the component in the z direction does not change. FIG. 15D shows support structures that rotate about the x-axis. This results in twisting of the flexible substrate, such that the component of the normal vector to the substrate surface in the x, y, and z-directions may change. It should be understood that these are exemplary examples, and are in no way limiting. In all of these embodiments, additional support structures may be added, e.g., a third portion, and the additional support structures are constrained to move in the same way. Any combination of the above motions may be applied to move the second portion of the support structure relative to the first portion of the support structure. For example, the motion shown in FIG. 15B may be combined with a rotation movement about the y-axis.

One specific example of a combination of movements is the combination of movements shown in FIG. 15B and FIG. 15C. For example, from an initial position, where the flexible substrate is fully extended such that it lies along the x-axis, the support structures could move towards each other along the x-axis as shown in FIG. 15B. However, to control whether the flexible substrate assumes a concave orientation (as in FIG. 15B relative to an irradiated plane below the substrate) or a convex orientation (not shown in FIG. 15B), an additional rotation may be required. If the support structure on the left in FIG. 15 is rotated counter-clockwise and the support structure on the right in FIG. 15 is rotated clockwise, then when the two support structures are also moved towards each other along the x-axis, the substrate will assume a concave orientation. However, if the support structure on the left in FIG. 15 is rotated clockwise and the support structure on the right in FIG. 15 is rotated counter-clockwise, then when the two support structures are also moved towards each other along the x-axis, the substrate will assume a convex orientation.

In one embodiment, the first and second portions of the support structure move out of a starting plane that, prior to the movement of the support structures, includes both support structures. In one embodiment, the first and second portions of the support structure move perpendicular to the starting plane. In another embodiment, the first and second portions of the support structure are located in a single plane, and the first and second portions of the support structure move within the plane where they are located.

In one embodiment, the first and second portions of the support structure rotate such that the flexible substrate is not twisted. In another embodiment, the first and second portions of the support structure rotate such that the flexible substrate is twisted.

In one embodiment, the second portion of the support structure is rotatable relative to the first portion of the support structure.

In one embodiment, the first and second portions of the support structure move in any combination of the first and second portions of the support structure move out of a starting plane that, prior to the movement of the support structures, includes both support structures; the first and second portions of the support structure move perpendicular to a starting plane that, prior to the movement of the support structures, includes both support structures; the first and second portions of the support structure are located in a single plane, and the first and second portions of the support structure move within the plane where they are located; the first and second portions of the support structure rotate such that the flexible substrate is not twisted; and the first and second portions of the support structure rotate such that the flexible substrate is twisted.

Figure 16:
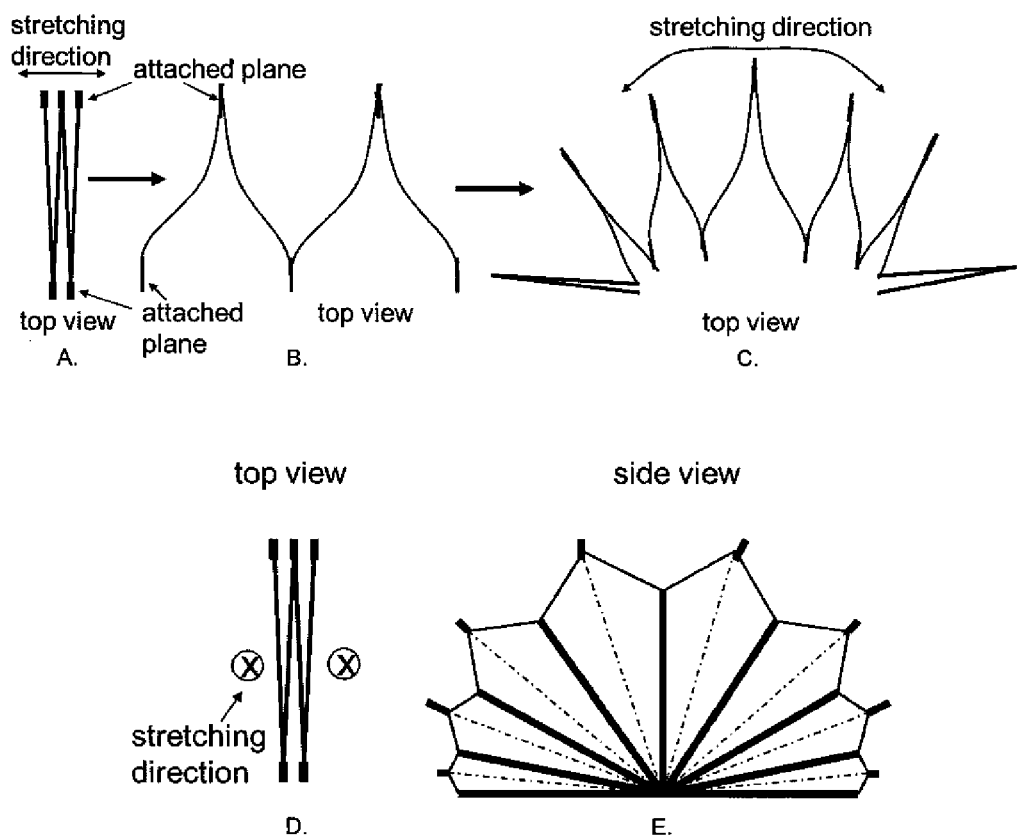
FIG. 16 shows an extendible accordion structure.

In one embodiment, the light source has an extendible accordion structure (illustrated in FIG. 16). As used herein, "accordion structure" refers to a plurality of flexible substrates that are stacked on top of one another and attached at alternating edges going down through the stack. For example, the third region of the first flexible substrate is attached to the third region of a second flexible substrate, the first region of the second flexible substrate is attached to the first region of a third flexible substrate, the third region of the third flexible substrate is attached to the third region of a fourth flexible substrate, and so on. The number of flexible substrates in the structure is arbitrary; however, to stretch and flex the structure in interesting ways, the structure should preferably contain at least three flexible substrates. In this example, we may consider the x-direction to run from the left of the page to the right of the page; the y-direction to run from the bottom of the page to the top of the page; and the z direction to run into the page. The stack of flexible substrates is placed parallel to the y-z plane. The accordion structure may be stretched and flexed in a number of interesting ways, including, but not limited to, moving the first flexible substrate in the stack away from the last flexible substrate in the stack by moving the last flexible substrate along the x-direction (FIG. 16B), moving the first flexible substrate in the stack relative to the last flexible substrate in the stack by rotating the flexible substrates about the z-axis (FIG. 16C), moving the first flexible substrate in the stack relative to the last flexible substrate in the stack by rotating the flexible substrates about the y-axis (FIG. 16D and FIG. 16E), and moving the first flexible substrate in the stack relative to the last flexible substrate in the stack by twisting the flexible substrates. One example of an "extendible accordion structure" is a Post-it® pad where adhesive is on an edge of each sheet of paper, and the sheets are attached to one another on alternating edges, e.g., the left side of a first sheet is attached to the left side of a second sheet, the right side of the second sheet is attached to the right side of a third sheet, the left side of the third sheet is attached to the left side of a fourth sheet, and so on. Such a Post-it® pad can be manipulated in such ways as illustrated in FIG. 16.

In one embodiment, substantially no OLED is disposed on the first and third regions of the first flexible substrate. In one embodiment, substantially no first OLED is deposited on the attachment point of the first and third regions of the first flexible substrate. In one embodiment, the first OLED is disposed on at least a portion of the first, second, and third regions of the first flexible substrate.

By "substantially no first OLED is deposited" it is meant that the emissive area of the OLED is not deposited in or on the attachment point of the first and third regions of the flexible substrate. This may generally correspond to no organic materials of the organic layers being deposited in or on the attachment point of the first and third regions of the flexible substrate, but some overlap may be permissible. Overspray of extra organic or other material not used within the OLED is permissible. It may also correspond to no anode materials or no cathode materials being deposited in or on the attachment point of the first and third regions of the flexible substrate, but some overlap may be permissible.

In one aspect, the movement of the second portion of the support structure relative to the first portion of the support structure changes a radius of curvature of the first flexible substrate. In another embodiment, the movement of the second portion of the support structure relative to the first portion of the support structure is constrained such that the minimum radius of curvature of the first flexible substrate is between 1.0 cm and 20.0 cm. As used herein, the radius of curvature refers to the radius of curvature at any given point as measured in the plane that results in the smallest measurement. The "minimum" radius of curvature of the first flexible substrate refers to the radius of curvature of the first flexible substrate that has the smallest value during the movements.

In one embodiment, the movement of the second portion of the support structure relative to the first portion of the support structure is constrained such that the minimum radius of curvature of the first flexible substrate is between 5.0 cm and 15.0 cm.

In one embodiment, an electrical connection is present through the first portion of the support structure and the first region of the flexible substrate. The electrical connection can be made using standard techniques described above and known to those of skill in the art.

Figure 8:
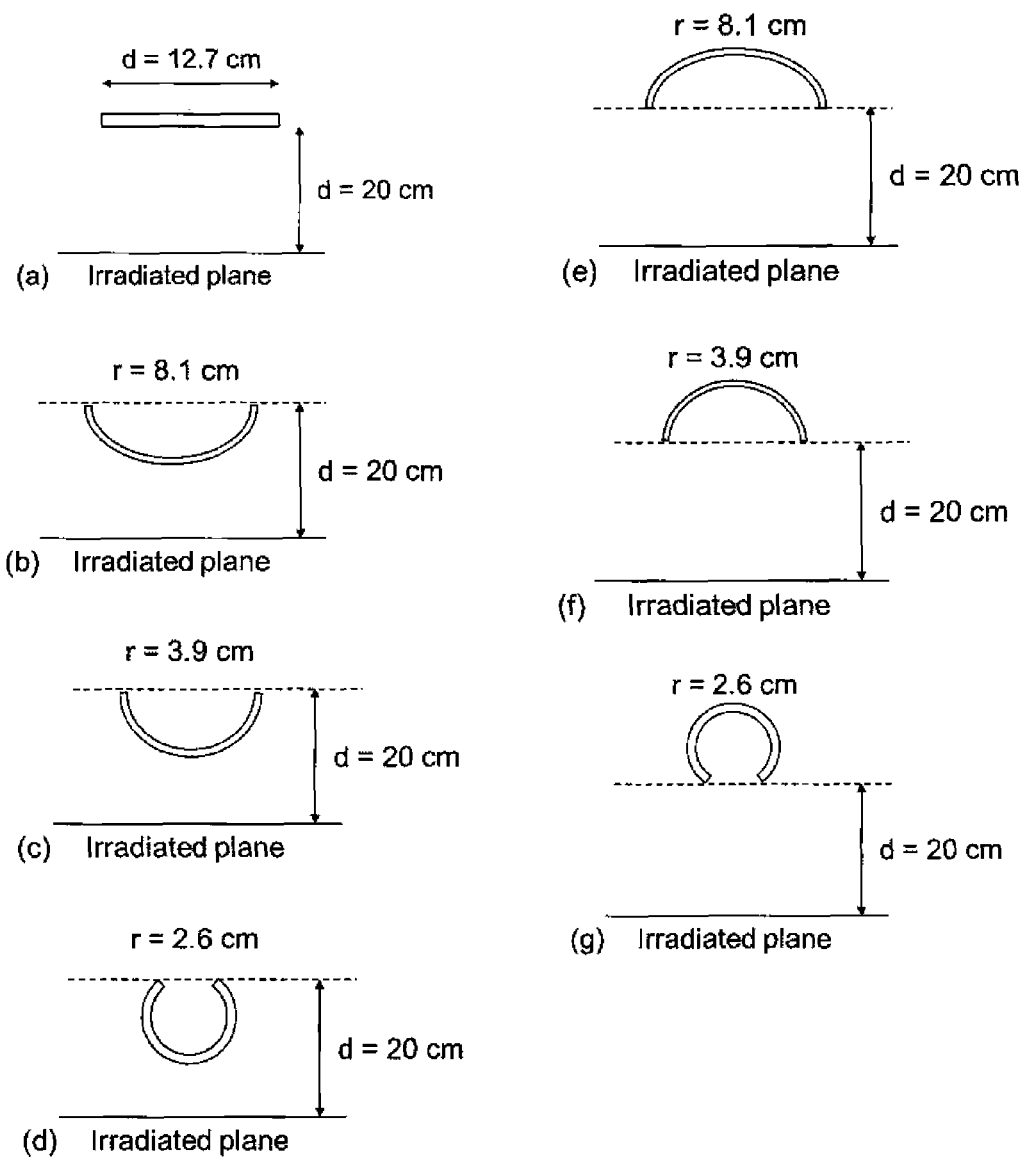
FIGS. 8a)-g) show various exemplary shapes and orientations for the flexible substrate of the light source relative to an irradiated plane.

FIG. 8 shows a schematic of embodiments of the flexible substrate in different shapes and orientations. These can be matched to the irradiance maps in FIGS. 9-11. FIG. 8a) shows an unflexed planar substrate. FIGS. 8b)-d) show the substrate flexed such that it is convex relative to an irradiated plane with radius of curvature (b) r=8.1 cm, (c) r=3.9 cm and (d) 2.6 cm. FIGS. 8e)-g) show the substrate flexed such that it is concave relative to an irradiated plane with radius of curvature (e) r=8.1 cm, (f) r=3.9 cm and (g) 2.6 cm. In each case, two sides of the substrate are fixed at a distance of d=20 cm from an irradiated plane.

In one embodiment, the change in the shape of the light source changes the distribution of radiant intensity emanating from the light source. The shape and orientation of the flexible substrates in the dynamic OLED light source may be used to control the distribution of radiant intensity emanating from the light source. Radiant intensity is measured in units of W/sr and is a measure of power emanating from the light source per unit solid angle. For a planar OLED light source, the radiant intensity distribution is expected to fall away as the cosine of the angle from the surface normal. It is anticipated that a convex substrate geometry may be used to spread light further away from the surface normal of the light source, while a concave geometry may be used to focus light towards the surface normal. In this description, the surface normal is considered to be perpendicular to the planar substrate geometry in FIG. 8a).

TracePro was used to model the optical system. The simulation parameters included providing a 12.7 cm×12.7 cm flexible substrate, with an OLED disposed over the entire substrate area. The OLED light source was assumed to emit blackbody radiation with correlated color temperature=3000 K and a Lambertian emission pattern. The irradiated plane was fixed at a distance of d=20 cm from the two substrate sides, as shown in FIG. 8. The shape and orientation of the substrate was varied, as shown in FIG. 8, and an irradiance map was generated on the irradiated plane for each shape and orientation. A total of $10^6$ rays were used in each simulation with a total emitted power of 70,274 W. In this model, radiometric descriptions, such as radiant intensity (W/sr), irradiance (W/m$^2$) and irradiated plane are used, where irradiance is calculated based on absolute power per unit area on the irradiated plane. For an illumination source providing visible light, photometric descriptions corrected for brightness perceived by the human eye, such as luminous intensity (lm/sr or cd), illuminance (lm/m$^2$ or lux) and illuminated plane, could also be used.

Figure 9:
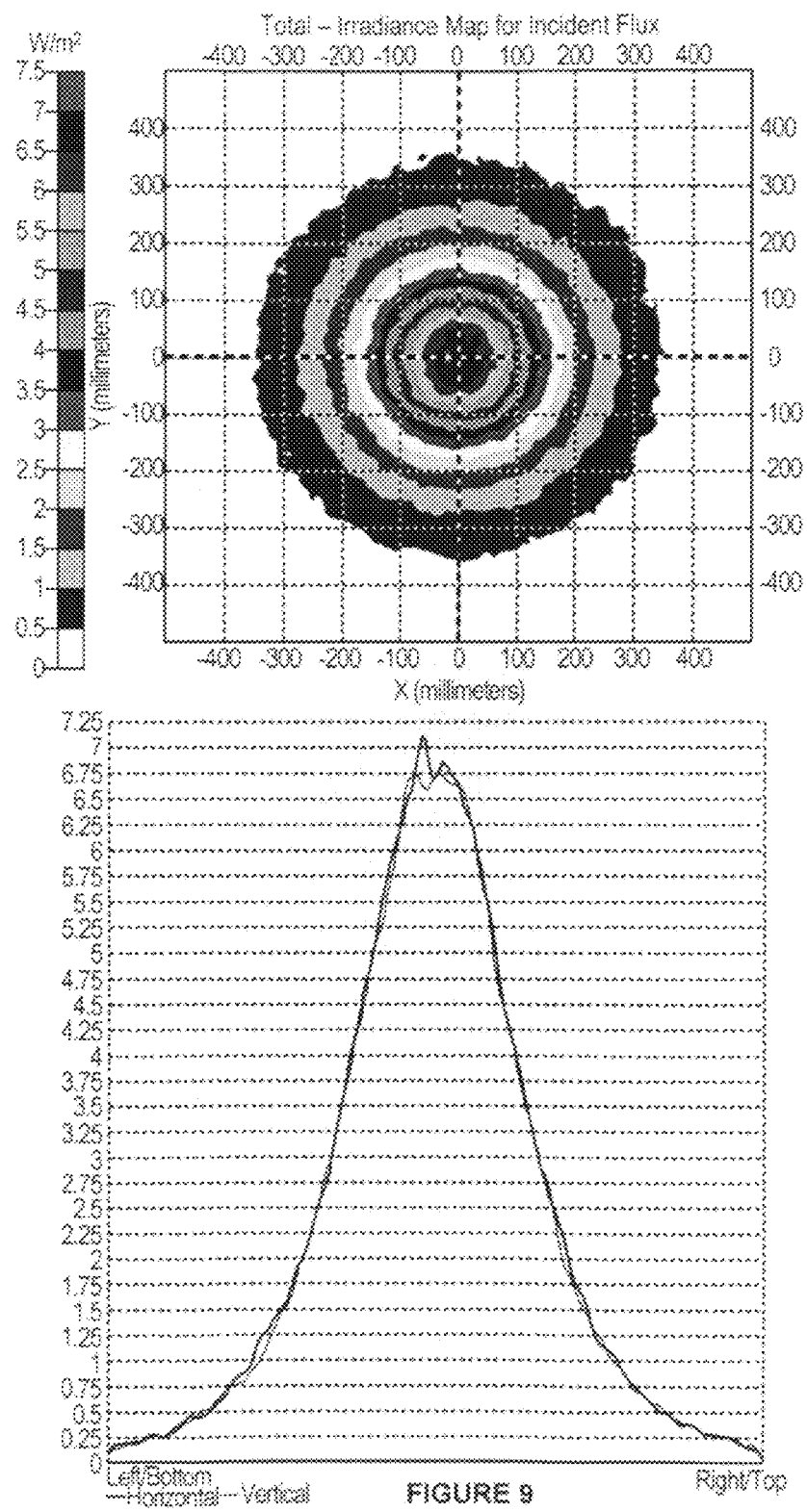
FIG. 9 shows the irradiance map of incident flux on the irradiated plane for the planar substrate geometry shown in FIG. 8a).

FIG. 9 shows the irradiance map of incident flux on the irradiated plane for the planar substrate geometry shown in FIG. 8a). Maximum irradiance of 7.5 W/m$^2$ is calculated on the irradiated plane directly beneath the center of the flexible substrate. The irradiance map is substantially symmetric, as shown by the irradiance map and graph in FIG. 9, where irradiance is plotted against distance in both x and y directions.

Figure 10A:
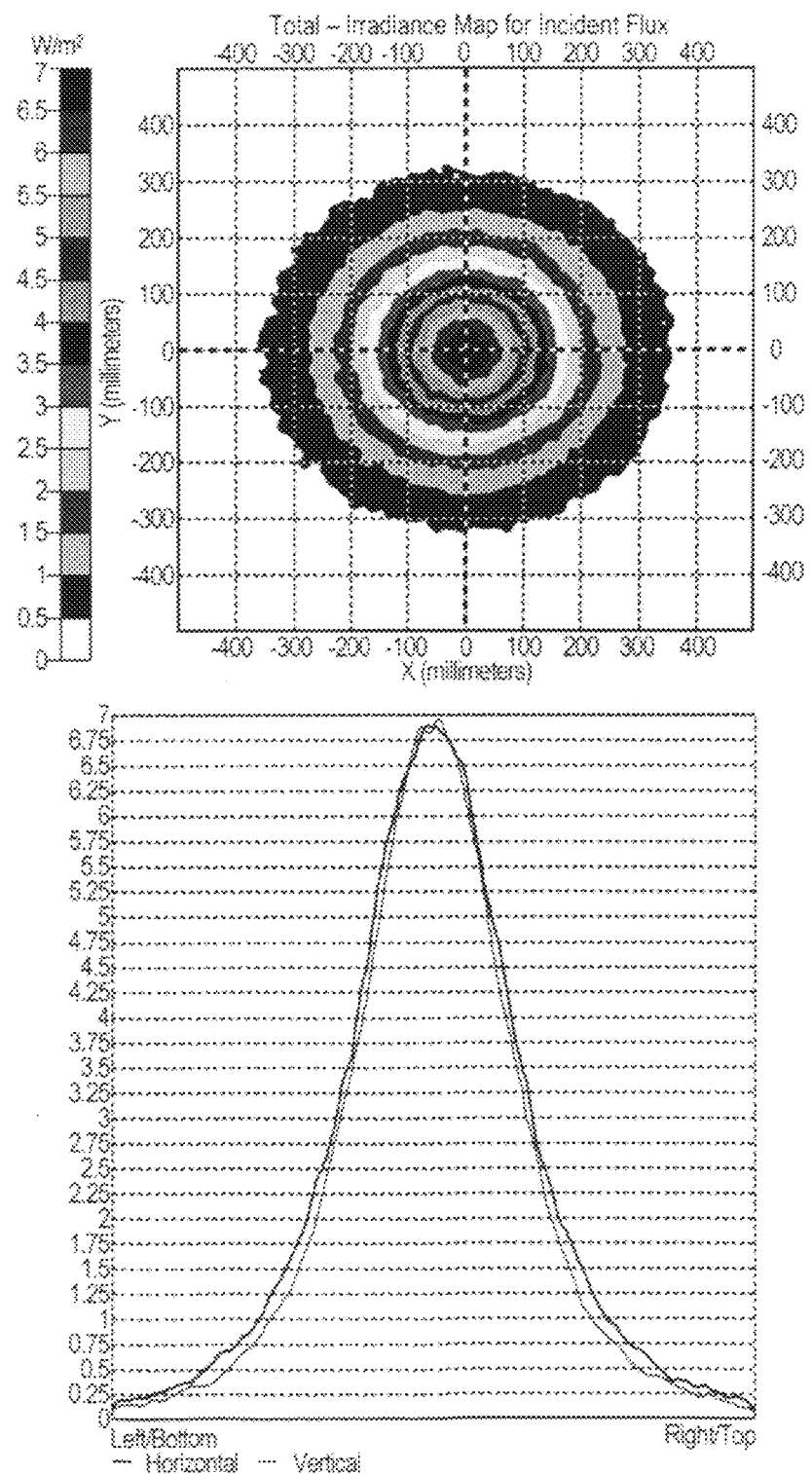
FIGS. 10A-C show irradiance maps of incident flux on the irradiated plane for an exemplary light source having a flexible substrate in a convex orientation. As the radius of curvature is decreased, light is spread further away from the surface normal.
Figure 10B:
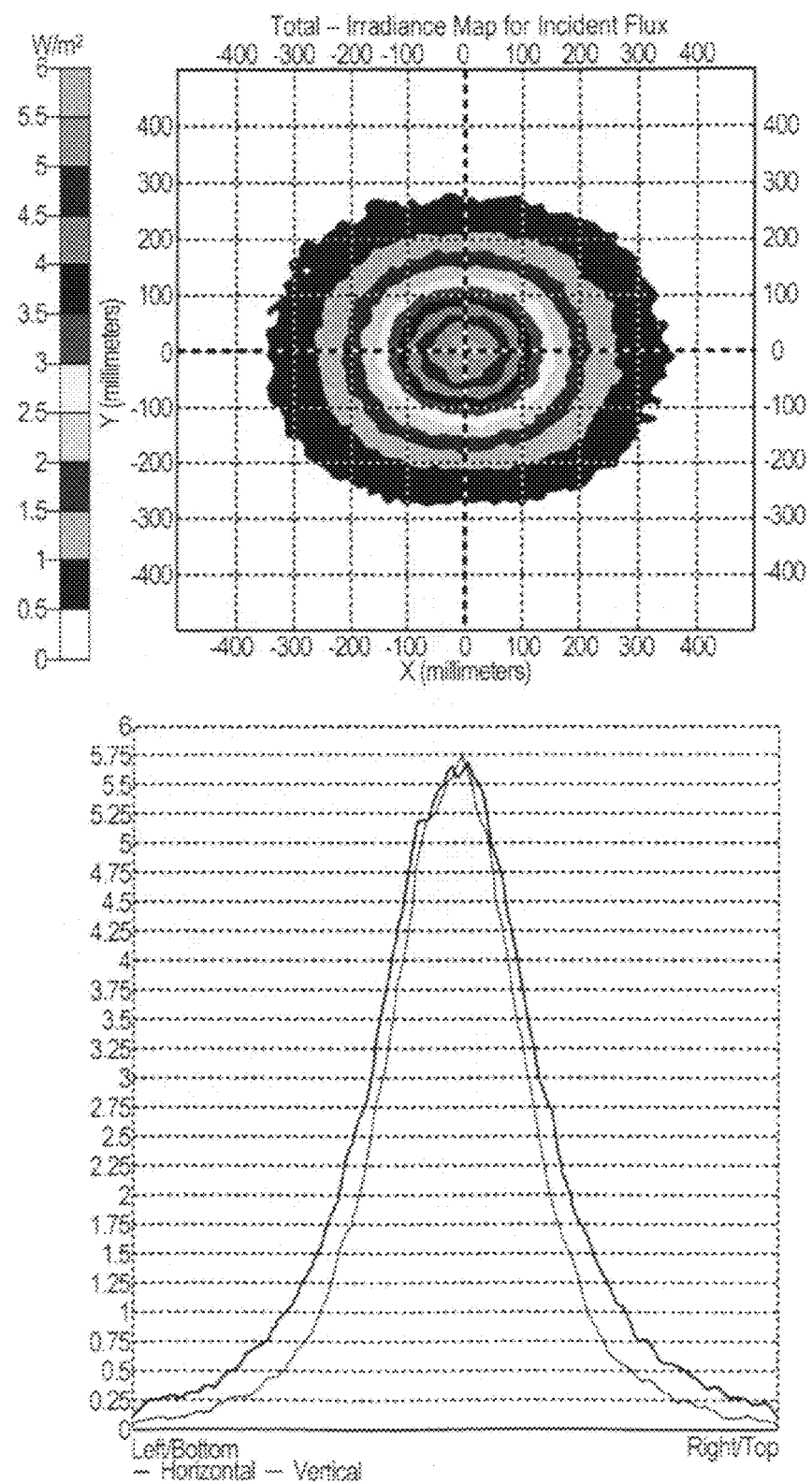
Figure 10C:
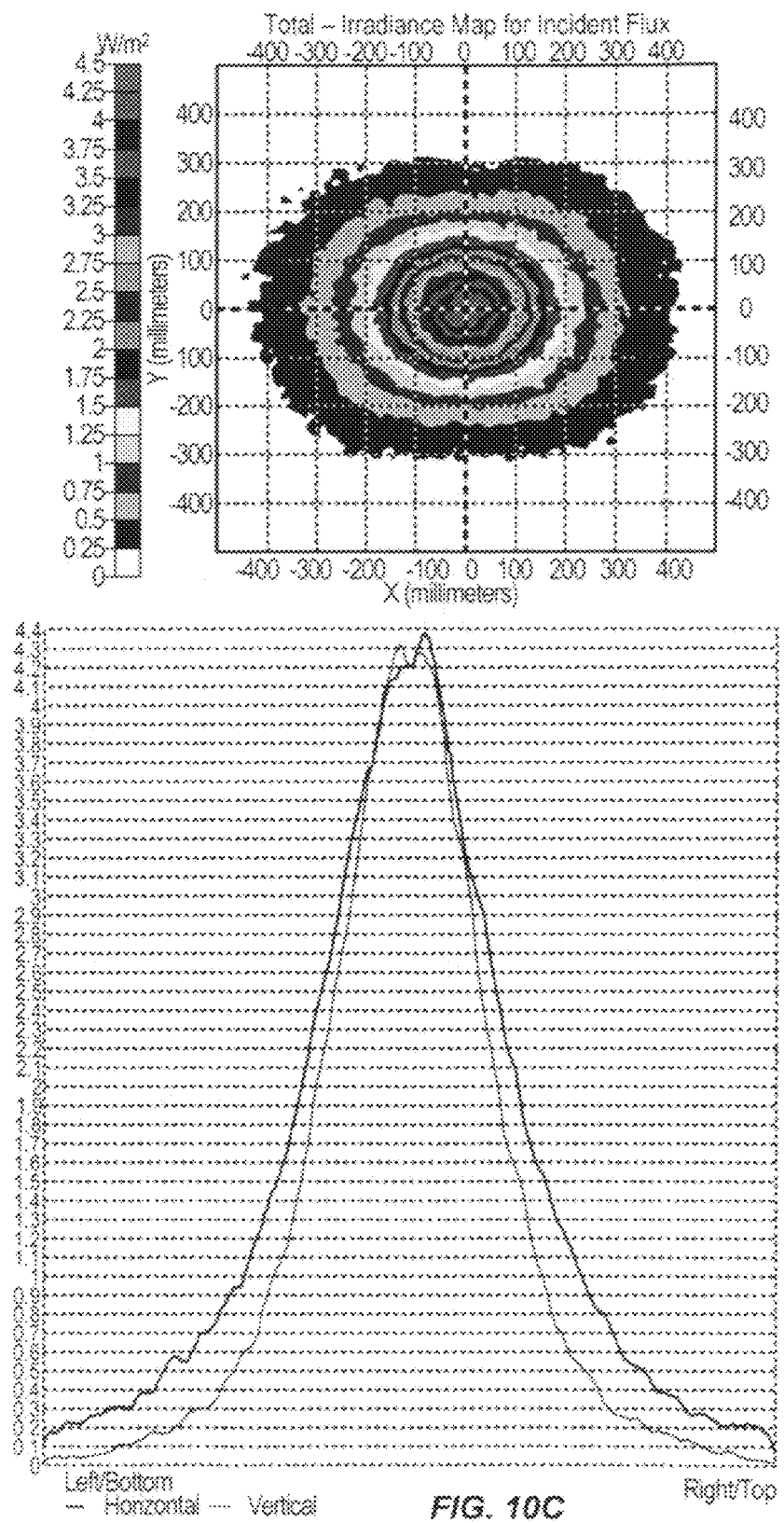

FIGS. 10A-C show that using a flexible substrate in a convex orientation, light may be redirected away from the surface normal. As the radius of curvature is decreased, light is spread further away from the surface normal (as illustrated in FIGS. 10A-C. The radiant intensity distribution may be anti-symmetric, as shown by the irradiance map and graph in FIG. 10C. For a convex radius of curvature r=2.6 cm, a maximum irradiance of 4.5 W/m$^2$ is calculated on the irradiated plane at a point directly beneath the center of the flexible substrate. This is lower than for the planar substrate geometry, even though the flexible substrate is closer to the irradiated plane at a point directly beneath the center of the flexible substrate. One possible reason for this is that the same radiant power is now spread over a larger area.

Figure 11A:
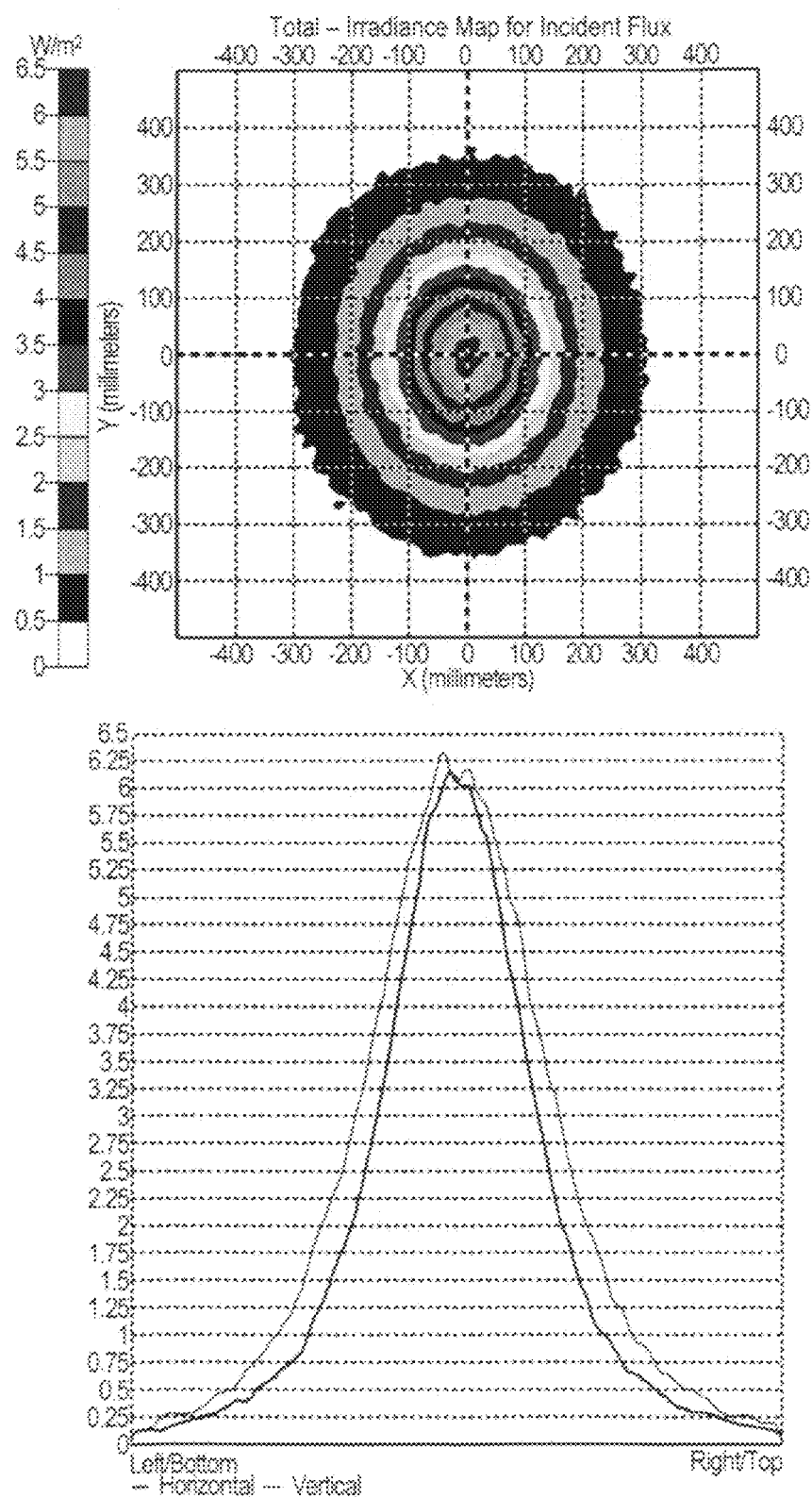
FIGS. 11A-C show irradiance maps of incident flux on the irradiated plane for an exemplary light source having a flexible substrate in a concave orientation. As the radius of curvature is decreased, light is focused towards the surface normal.
Figure 11B:
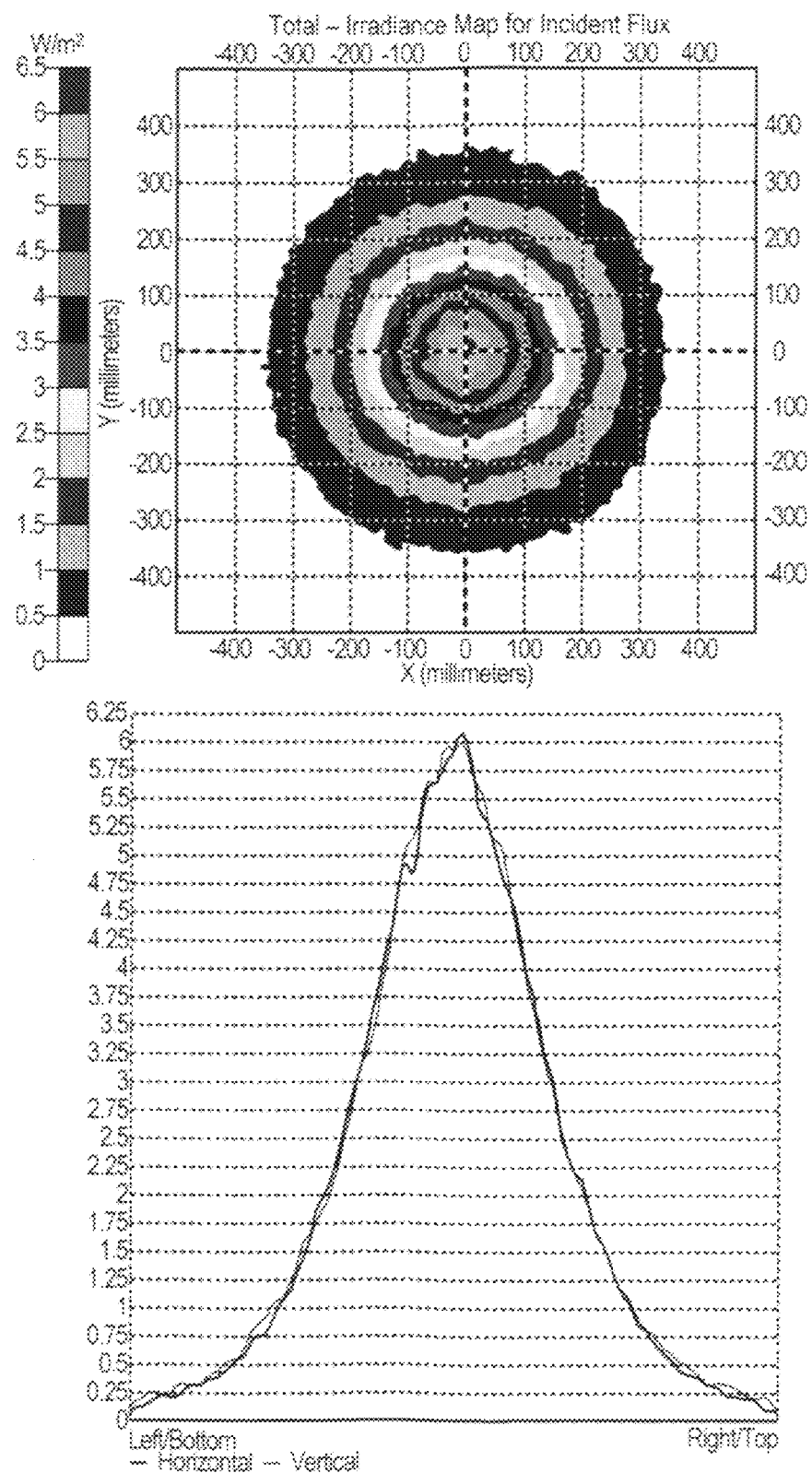
Figure 11C:
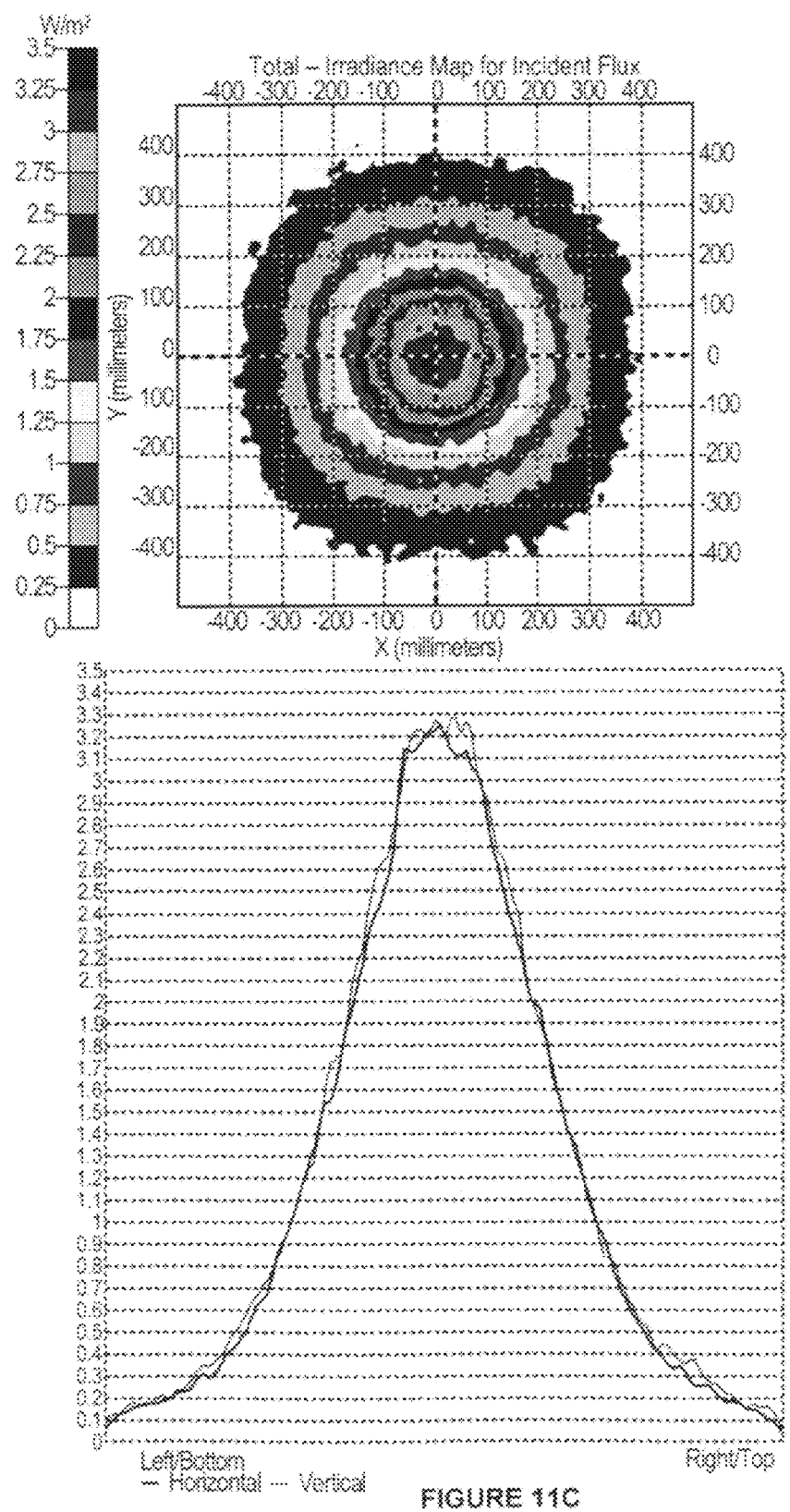

FIGS. 11A-C show that using a flexible substrate in a concave orientation, light may be redirected towards the surface normal. As the radius of curvature is decreased, at first, light is focused towards the surface normal, as shown in FIGS. 11A and 11B. However, if the radius of curvature is decreased further, as shown in FIG. 11C, shadowing effects dominate, and the effect is reduced. For a concave radius of curvature r=3.9 cm, a maximum irradiance of 6.5 W/m$^2$ is calculated on the irradiated plane at a point directly beneath the center of the flexible substrate, and as shown by the irradiance map and graph in FIG. 11B, the radiant intensity distribution may become anti-symmetric. The maximum irradiance for this geometry (6.5 W/m$^2$) is lower than for the planar geometry (7.5 W/m$^2$). The reason for this is the increased distance from the flexible substrate to the irradiated plane at a point directly beneath the center of the flexible substrate.

In one embodiment, the change in shape and orientation of the light source can change the radiant intensity distribution emanating from the light source from a symmetric distribution to an asymmetric distribution with respect to one axis of the light source. The asymmetry in the radiant intensity distribution results from movement of the structural supports and the resulting flexing of the flexible substrates. In one aspect, the change in shape of the light source increases the irradiance of at least one point on an irradiance plane by as much as about 2 fold compared to the irradiance prior to the change in shape. In another aspect, the change in shape of the light source decreases the irradiance of at least one point on an irradiance plane by as much as about 2 fold compared to the irradiance prior to the change in shape. This may be desirable for many light fixtures as it allows for illumination to be dynamically controlled. This may allow for illumination to be increased in particular areas and for illumination in other areas to be dependently or independently decreased.

In one embodiment, the first and second portions of the support structure are connected by an elastic connection. In one aspect, the first flexible substrate is attached to the elastic connection through the first and second portion of the support structures, as depicted in FIG. 12A. The first OLED is disposed onto the first flexible substrate, and the shape of at least a part of the first OLED along with the first flexible substrate change when expanding or shrinking the support structures through the elastic connection. In one aspect, the first flexible substrate is attached onto the elastic connection through the first, second and the third portions of the support structures, as depicted in FIG. 12B. In one embodiment, the first OLED is disposed on the second and fourth regions of the first substrate. In one embodiment, a first OLED is disposed on the second region of the first substrate and a second OLED is disposed on the fourth region of the first substrate, wherein at least part of the shape of the second OLED change when the third portion of the support structure is moved relative to the second portion of the support structure. In one aspect, a second flexible substrate is attached onto the elastic connection and shares the second support structure with the first flexible substrate, where a second OLED is disposed onto the second substrate, as depicted in FIG. 12C. In one aspect, the support structure further comprises a fourth portion, where the first flexible substrate with a first OLED disposed on it is attached to the elastic connection through the first and second portions of the support structure, while the second substrate with a second OLED disposed on it is attached to the elastic connection through the third and the fourth portions of the support structure. This is depicted in FIG. 12D. The elastic connection may be, but is not limited to, a sheet of elastic film, or one or a plurality of elastic strings. In one embodiment, the elastic connection comprises a light scattering layer, as depicted in FIG. 12E.

In some embodiments, the light source contains no transistors.

COMBINATION WITH OTHER MATERIALS

The materials described herein as useful for a particular layer in an organic light emitting device may be used in combination with a wide variety of other materials present in the device. These other materials are disclosed in U.S. Patent Publication Nos. 2010/0295032 and 2011/0057559, which are incorporated herein by reference.

EXPERIMENTAL

Figure 17:
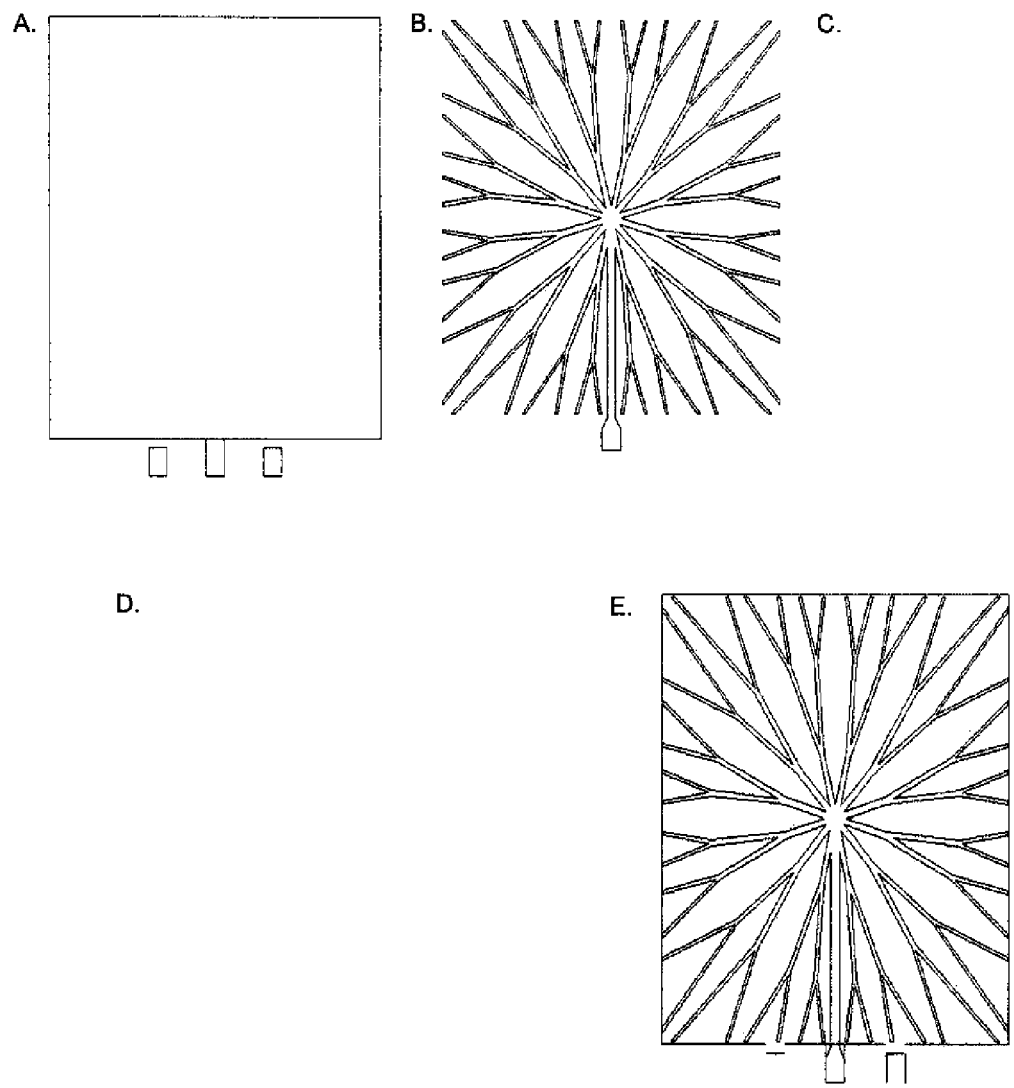
FIG. 17 shows the layout of various layers in a light source.
Figure 18:
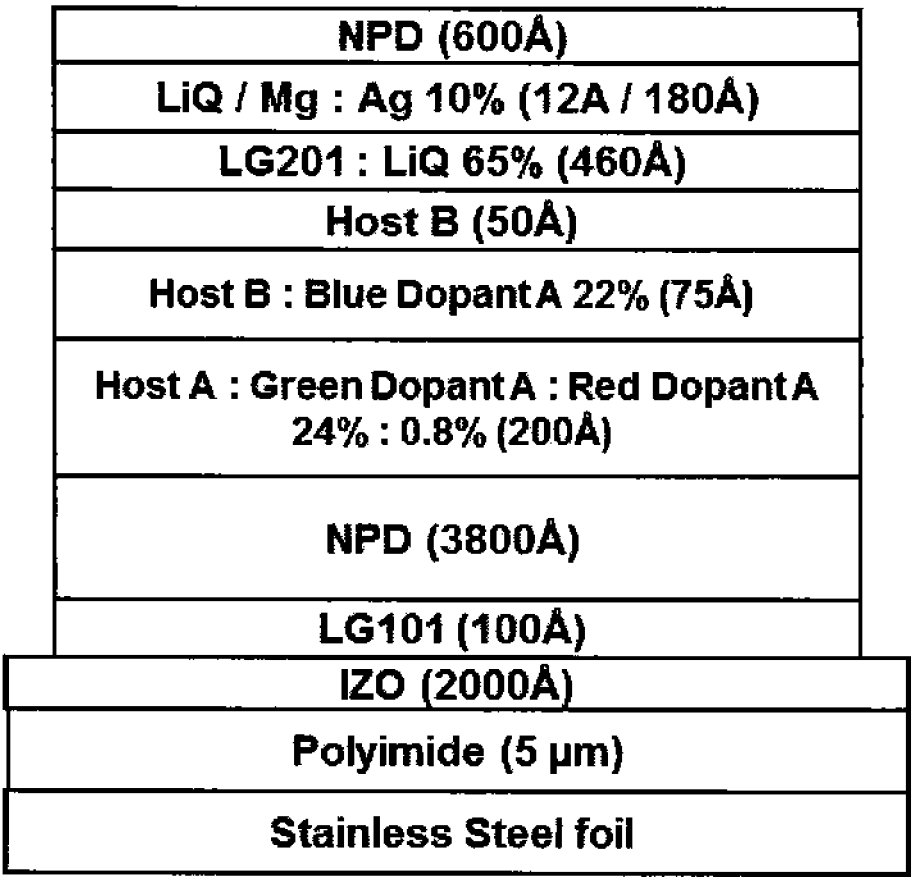
FIG. 18 shows a device stack of an exemplary light source.

Two 15 cm×15 cm OLED panels were designed and fabricated on 30 μm stainless steel foil with 5 μm planarization layer on top of the foil substrate. The planarization layer was spun-on polyimide cured at 250° C. in vacuum oven. The layout of the panel is shown in FIG. 17E. The details of the OLED stack are as follows: an anode layer of 2000 Å thickness IZO was deposited by sputtering onto the polymer coated foil substrate. For the panel, the anode layout is shown in FIG. 17A. In order to improve the luminance uniformity, 2000 Å aluminum (Al) was deposited on the anode by vacuum thermal evaporation (VTE) through shadow mask to form a network of highly conductive bus lines. The pattern of the bus line layer is shown in FIG. 17B. This was followed by the organic layers, which were deposited by VTE through the shadow mask layout shown in FIG. 17C. The organic stack comprised: a 100 Å thickness hole injection layer (HIL) of LG101 (purchased from LG Chemical Co., Korea); a 3800 Å thickness hole transport layer (HTL) of NPD; a 200 Å thickness first emissive layer (EML) comprising Host A with 24% wt. Green Dopant A and 0.8% wt. Red Dopant A; a 75 Å thickness second emissive layer comprising Host B with 22% wt. Blue Dopant A; a 50 Å thickness hole blocking layer (BL) of Host B; a 460 Å thickness electron transport layer (ETL) of LG201 (purchased from LG Chemical Co., Korea) doped with 65% wt. Liq; and a 12 Å thickness electron injection layer (EIL) of Liq. A cathode of 180 Å thickness magnesium doped with 10% silver was then deposited by VTE onto the organic stack. For the panel, the cathode layout is shown in FIG. 17D. A 600 Å thickness NPD was deposited on top of cathode to protect the Mg:Ag cathode from being oxidized during following process as well as to improve light extraction. The OLED stack is shown in FIG. 18, where for simplicity the Al bus lines are not shown. Finally, a 2 μm thick thin-film encapsulation (TFE) layer was deposited on top of the finished device through plasma-enhanced-chemical-vapor-deposition (PECVD), to prevent moisture and oxygen from damaging the OLED device. The TFE is also omitted, for simplicity, from the schematic in FIG. 18. FIG. 18 is a schematic of the device stack of the device described above and illustrated in FIG. 17.

With respect to OLED deposition, the anode and/or bus lines can be deposited by VTE (vacuum thermal deposition) or sputtering through a shadow mask, or blanket deposited and then patterned using photolithography. Examples of anode materials include, but are not limited to, IZO, ITO, Al, Ag or combinations thereof. Examples of bus line materials include, but are not limited to, Al, Ag, Au, and Cu.

Figure 19:
FIGS. 19A-C show an exemplary dynamic light source comprising two OLED panels and three support structures, which are connected by elastic string.
Figure 19:
Figure 19:

FIG. 19 demonstrates a dynamic light source using the two OLED panels fabricated on foil substrates as described above. An apparatus with three support structures was built to facilitate the demonstration. The support structures were connected through an elastic string such that they can move relatively to each other. The two flexible OLED panels were mounted to the support structures using adhesive tape. FIG. 19A shows the initial state of the two panels without any external force while illuminated, which is equivalent to the illustration in FIG. 21. The radius of the curvature of the left substrate is about 4.6 cm. When the string was pulled through external force (by hand, in this example), the support structures moved apart from each other, and the radius of the curvature of the left substrate increases to about 12.2 cm, as shown in FIG. 19B. Note that the movement of the support structure is constrained by the dimension of the panel. FIG. 19C shows the support structures extended to the maximum distance, where the two OLED panels were stretched to flat. This example clearly demonstrates the invention that OLED light sources dynamically change curvature through support structures while illuminated.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A light source comprising:
   a support structure having at least a first and a second portion;
   a first flexible substrate having at least a first, a second and a third region;
      wherein the first region of the first flexible substrate is attached to the first portion of the support structure;
      wherein the third region of the first flexible substrate is attached to the second portion of the support structure; wherein a first OLED is disposed on at least part of the second region of the first flexible substrate;
      wherein the shape of the second region of the first flexible substrate and the shape of at least a part of the first OLED change when the first portion of the support structure is moved relative to the second portion of the support structure; and
      wherein the first and second portions of the support structure are connected by an elastic connection.

2. The light source of claim 1, wherein the second portion of the support structure is movably attached to the first portion of the support structure.

3. The light source of claim 1: wherein the support structure further comprises a third portion; wherein the first flexible substrate further comprises a fourth and a fifth region; wherein the fifth region of the first flexible substrate is attached to the third portion of the support structure; and wherein the shape of the fourth region of the first flexible substrate changes when the third portion of the support structure is moved relative to the second portion of the support structure.

4. The light source of claim 3, wherein the first OLED is disposed on at least part of the second region and at least part of the fourth region of the first flexible substrate; and wherein the shape of at least a part of the first OLED changes when the first portion of the support structure is moved relative to the second portion of the support structure or the third portion of the support structure is moved relative to the second portion of the support structure.

5. The light source of claim 3, further comprising a second OLED; wherein the first OLED is disposed on at least part of the second region of the first flexible substrate, and the second OLED is disposed on at least part of the fourth region of the first flexible substrate; and wherein the shape of at least a part of the second OLED changes when the third portion of the support structure is moved relative to the second portion of the support structure.

6. The light source of claim 3, wherein the third portion of the support structure is movably attached to the second portion of the support structure.

7. The light source of claim 1, wherein the light source further comprises a second flexible substrate having at least a first, a second, and a third region; wherein a second OLED is disposed on at least part of the second region of the second substrate; wherein the support structure further comprises a third portion; wherein the first region of the second flexible substrate is attached to the second portion of the support structure; wherein the third region of the second flexible substrate is attached to the third portion of the support structure; and wherein the shape of the second region of the second flexible substrate and the shape of at least a part of the second OLED change when the third portion of the support structure is moved relative to the second portion of the support structure.

8. The light source of claim 7, wherein the third portion of the support structure is movably attached to the second portion of the support structure.

9. The light source of claim 1, wherein: the support structure further comprises a third portion and a fourth portion; at least one of the first and second portions of the support structure is movably attached to at least one of the third and fourth portions of the support structure; the light source comprises a second flexible substrate having a first region, a second region and a third region; a second OLED is disposed on at least part of the second flexible substrate; the first region of the second flexible substrate is attached to the third portion of the support structure; the third region of the second flexible substrate is attached to the fourth portion of the support structure; and the shape of the second region of the second flexible substrate and the shape of at least a part of the second OLED change when the fourth portion of the support structure is moved relative to the third portion of the support structure.

10. The light source of claim 9, wherein the fourth portion of the support structure is movably attached to the third portion of the support structure.

11. A light source comprising:
   a support structure having at least a first and a second portion;
   a first flexible substrate having at least a first, a second and a third region; and
   at least one rigid substrate;
      wherein the first region of the first flexible substrate is attached to the first portion of the support structure:
      wherein the third region of the first flexible substrate is attached to the second portion of the support structure; wherein a first OLED is disposed on at least part of the second region of the first flexible substrate; and
      wherein the shape of the second region of the first flexible substrate and the shape of at least a part of the first OLED change when the first portion of the support structure is moved relative to the second portion of the support structure.

12. The light source of claim 11, wherein a third OLED is disposed onto the at least one rigid substrate.

13. The light source of claim 11, comprising: a plurality of flexible substrates operably attached to one rigid substrate; wherein the plurality of flexible substrates comprises one or more OLEDs disposed on the plurality of flexible substrates.

14. The light source of claim 1, wherein the flexible substrate comprises metal foil, plastic, glass, or combinations thereof.

15. The light source of claim 1, wherein the first and second portions of the support structure move out of a starting plane that, prior to the movement of the support structures, includes both support structures.

16. The light source of claim 15, wherein the first and second portions of the support structure move perpendicular to a starting plane that, prior to the movement of the support structures, includes both support structures.

17. The light source of claim 1, wherein the first and second portions of the support structure are located in a single plane, and the first and second portions of the support structure move within the plane where they are located.

18. The light source of claim 1, wherein the first and second portions of the support structure move in any combination of the motions selected from the group consisting of: the first and second portions of the support structure move out of a starting plane that, prior to the movement of the support structures, includes both support structures; the first and second portions of the support structure move perpendicular to a starting plane that, prior to the movement of the support structures, includes both support structures; the first and second portions of the support structure are located in a single plane, and the first and second portions of the support structure move within the plane where they are located; the first and second portions of the support structure rotate such that the flexible substrate is not twisted; and the first and second portions of the support structure rotate such that the flexible substrate is twisted.

19. The light source of claim 1, wherein the light source has an extendible accordion structure.

20. The light source of claim 1, wherein substantially no first OLED is disposed on the first and third regions of the first flexible substrate.

21. The light source of claim 1, wherein substantially no first OLED is deposited on the attachment point of the first and third regions of the first flexible substrate.

22. The light source of claim 1, wherein the first OLED is disposed on at least a portion of the first, second, and third regions of the first flexible substrate.

23. The light source of claim 1, wherein the movement of the second portion of the support structure relative to the first portion of the support structure changes a radius of curvature of the first flexible substrate.

24. The light source of claim 1, wherein the movement of the second portion of the support structure relative to the first portion of the support structure is constrained such that the minimum radius of curvature of the first flexible substrate is between 1.0 cm and 20.0 cm.

25. The light source of claim 24, wherein the movement of the second portion of the support structure relative to the first portion of the support structure is constrained such that the minimum radius of curvature of the first flexible substrate is between 5.0 cm and 15.0 cm.

26. The light source of claim 1, wherein an electrical connection is present through the first portion of the support structure and the first region of the flexible substrate.

27. The light source of claim 1, wherein the change in shape of the light source changes the distribution of radiant intensity emanating from the light source.

28. The light source of claim 1, wherein the change in shape of the light source can change the distribution of radiant intensity emanating from the light source from a symmetric profile to an asymmetric profile with respect to one axis of the light source.

29. The light source of claim 1, wherein the elastic connection comprises a light scattering layer.

30. The light source of claim 1, wherein the change in shape of the light source increases the irradiance of at least one point on an irradiance plane by as much as about 2 fold compared to the irradiance prior to the change in shape.

31. The light source of claim 1, wherein the change in shape of the light source decreases the irradiance of at least one point on an irradiance plane down by as much as about 2 fold compared to the irradiance prior to the change in shape.

32. A light source comprising:
a support structure having at least a first and a second portion;
wherein the first portion has a first axis of rotation about which it can rotate;
wherein the second portion has a second axis of rotation about which it can rotate;
wherein the first and second portions of the support structure are rotatable about their respective axes of rotation without otherwise moving relative to each other;
a first flexible substrate having at least a first, a second and a third region;
wherein the first region of the first flexible substrate is fixedly attached to the first portion of the support structure;
wherein the third region of the first flexible substrate is fixedly attached to the second portion of the support structure;
wherein a first OLED is disposed on at least part of the second region of the first flexible substrate; and
wherein the shape of the second region of the first flexible substrate and the shape of at least a part of the first OLED change when the first portion of the support structure is rotated relative to the second portion of the support structure.

33. The light source of claim 32, wherein the first and second portions of the support structure rotate such that the flexible substrate is not twisted.

34. The light source of claim 32, wherein the first and second portions of the support structure rotate such that the flexible substrate is twisted.

35. The light source of claim 32, wherein the second portion of the support structure is rotatable relative to the first portion of the support structure.

* * * * *